US012768039B2

(12) United States Patent
Shin et al.

(10) Patent No.: US 12,768,039 B2
(45) Date of Patent: Oct. 20, 2026

(54) SUBSTRATE PROCESSING APPARATUS AND SUBSTRATE PROCESSING METHOD USING THE SAME

(71) Applicant: SAMSUNG ELECTRONICS CO., LTD., Suwon-si (KR)

(72) Inventors: Dongho Shin, Suwon-si (KR); Hanhim Kang, Suwon-si (KR); Seungjae Kim, Suwon-si (KR); Oh-Hyuk Kwon, Suwon-si (KR); Jaeho Park, Suwon-si (KR); Hongtaek Lim, Suwon-si (KR); Eun-Kyung Hong, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 124 days.

(21) Appl. No.: 18/647,721

(22) Filed: Apr. 26, 2024

(65) Prior Publication Data

US 2025/0146130 A1 May 8, 2025

(30) Foreign Application Priority Data

Nov. 7, 2023 (KR) ........................ 10-2023-0152612

(51) Int. Cl.
*C23C 16/455* (2006.01)

(52) U.S. Cl.
CPC .. *C23C 16/45523* (2013.01); *C23C 16/45519* (2013.01); *C23C 16/45557* (2013.01); *C23C 16/45589* (2013.01)

(58) Field of Classification Search
CPC ........ C23C 16/45523; C23C 16/45519; C23C 16/45557; C23C 16/45589
See application file for complete search history.

(56) References Cited

U.S. PATENT DOCUMENTS 9,268,340 B2 2/2016 Womack et al.
9,536,745 B2 1/2017 Narushima et al.
(Continued)

FOREIGN PATENT DOCUMENTS

CN 201136892 Y 10/2008
CN 112962085 A 6/2021
CN 215251164 U 12/2021

OTHER PUBLICATIONS

H. Kim, "Atomic layer deposition of metal and nitride thin films: Current research efforts and applications for semiconductor device processing", Journal of Vacuum Science & Technology B, vol. 21, No. 6, Nov. 2003, pp. 2231-2261, DOI: 10.1116/1.1622676.
(Continued)

*Primary Examiner* — Kelly M Gambetta
(74) *Attorney, Agent, or Firm* — Sughrue Mion, PLLC

(57) ABSTRACT

Substrate processing apparatuses and methods are provided. A substrate processing apparatus includes placing a first substrate on a first stage in a process chamber, placing a second substrate on a second stage in the process chamber, performing a first deposition process on the first substrate, and performing a second deposition process on the second substrate. The performing the first deposition process includes supplying the first substrate with a first gas. The performing the second deposition process includes supplying the second substrate with a second gas. The supplying the first substrate with the first gas includes alternately and repeatedly performing steps of filling a first gas supply unit with the first gas for a first time length, and supplying the first substrate with the first gas for a second time length. The second time length is greater than the first time length.

18 Claims, 22 Drawing Sheets

(56) References Cited

U.S. PATENT DOCUMENTS

| | | | | |
|---|---|---|---|---|
| 10,094,018 | B2 | 10/2018 | Kumar et al. | |
| 10,167,558 | B1 | 1/2019 | Lie et al. | |
| 10,428,419 | B2 | 10/2019 | Huotari et al. | |
| 10,870,919 | B2 | 12/2020 | Yamaguchi et al. | |
| 2014/0120723 | A1* | 5/2014 | Fu | H01L 21/32051 438/680 |
| 2017/0271183 | A1* | 9/2017 | Brashear | H01L 21/67017 |

OTHER PUBLICATIONS

S. O. Kucheyev et al., "Mechanisms of Atomic Layer Deposition on Substrates with Ultrahigh Aspect Ratios", Langmuir, vol. 24, No. 3, Jan. 2008, pp. 943-948, DOI: 10.1021/la7018617.
Yohei Kotsugi et al., "Atomic Layer Deposition of Ru for Replacing Cu-Interconnects", Chemistry of Materials, vol. 33, No. 14, Jul. 2021, pp. 5639-5651, DOI: 10.1021/acs.chemmater.1c01054.
Jeong Min Hwang et al., "Atomic layer deposition of a ruthenium thin film using a precursor with enhanced reactivity", Journal of Materials Chemistry C, vol. 9, No. 11, Mar. 2021, pp. 3820-3825, DOI: 10.1039/d0tc05682k.
Hye-Mi Kim et al., "Area-Selective Atomic Layer Deposition of Ruthenium Using a Novel Ru Precursor and $H_2O$ as a Reactant", Chemistry of Materials, vol. 33, No. 12, Jun. 2021, pp. 4353-4361, DOI: 10.1021/acs.chemmater.0c04496.
Il-Kwon Oh et al., "Role of Precursor Choice on Area-Selective Atomic Layer Deposition", Chemistry of Materials, vol. 33, No. 11, May 2021, pp. 3926-3935, DOI: 10.1021/acs.chemmater.0c04718.
Ja-Yong Kim et al., "Step coverage modeling of thin films in atomic layer deposition", Journal of Applied Physics, vol. 101, No. 7, Article No. 073502, Apr. 2007, 7 pages, DOI: 10.1063/1.2714685.
Andrew J. Gayle et al., "Tunable Atomic Layer Deposition into Ultra-High-Aspect-Ratio (>60000:1) Aerogel Monoliths Enabled by Transport Modeling", Chemistry of Materials, vol. 33, No. 14, Jul. 2021, pp. 5572-5583, DOI: 10.1021/acs.chemmater.1c00770.
Roy G. Gordon et al., "A Kinetic Model for Step Coverage by Atomic Layer Deposition in Narrow Holes or Trenches", Chemical Vapor Deposition, vol. 9, No. 2, Mar. 203, pp. 73-78, DOI: 10.1002/cvde.200390005.
John E. Crowell, "Chemical methods of thin film deposition: Chemical vapor deposition, atomic layer deposition, and related technologies", Journal of Vacuum Science & Technology A, vol. 21, No. 5, Sep. 2003, pp. S88-S95, DOI: 10.1116/1.1600451.
Sumita Basu et al., "Looking Towards a Sustainable and Green Future", IEEE/SEMI Advanced Semiconductor Manufacturing Conference, 2011, 5 pages.
Hwanyeol Park et al., "Dissociation reaction of $B_2H_6$ on TiN surfaces during atomic layer deposition: first- principles study", RSC Advances, vol. 7, No. 88, Dec. 2017, p. 55750-55755, DOI: 10.1039/c7ra11291b.
Soo Hyun Kim et al., "Effects of $B_2H_6$ Pretreatment on ALD of W Film Using a Sequential Supply of WF6 and SiH4", Electrochemical and Solid-State Letters, vol. 8, No. 10, Aug. 2005, pp. C155-C159, DOI: 10.1149/1.2035703.
Hwanyeol Park et al., "Effects of H2 and N2 treatment for $B_2H_6$ dosing process on TiN surfaces during atomic layer deposition: an ab initio study", RSC Advances, vol. 8, No. 38, Jun. 2018, pp. 21164-21173, DOI: 10.1039/c8ra02622j.
Hwanyeol Park et al., "Overall reaction mechanism for a full atomic layer deposition cycle of W films on TiN surfaces: first-principles study", RSC Advances, vol. 8, No. 68, Nov. 2018, p. 39039-39046, DOI: 10.1039/c8ra07354f.
Soo-Hyun Kim et al., "Phase and Microstructure of ALD-W Films Deposited Using $B_2H_6$ and $WF_6$ and Their Effects on CVD-W Growth", Journal of The Electrochemical Society, vol. 155, No. 2, 2008 (published Dec. 2007), pp. D148-D154, DOI 10.1149/1.2815962.

* cited by examiner

SUBSTRATE PROCESSING APPARATUS AND SUBSTRATE PROCESSING METHOD USING THE SAME

CROSS-REFERENCE TO RELATED APPLICATION

This U.S. non-provisional application claims priority under 35 U.S.C § 119 to Korean Patent Application No. 10-2023-0152612, filed on Nov. 7, 2023, in the Korean Intellectual Property Office, the disclosure of which is hereby incorporated by reference in its entirety.

BACKGROUND

1. Technical Field

Embodiments of the present disclosure relate to a substrate processing apparatus and a substrate processing method using the same, and more particularly, to a substrate processing apparatus capable of increasing deposition efficiency to reduce gas consumption and a substrate processing method using the same.

2. Brief Description of Related Art

A semiconductor device may be fabricated through various processes. For example, the semiconductor device may be manufactured through a photolithography process, an etching process, a deposition process, and a plating process. A gas may be sprayed onto a substrate in a deposition process for fabricating semiconductor devices. A deposition process may be simultaneously performed on a plurality of substrates in one process chamber. In this case, various kinds of gas may be sprayed at the same time into one process chamber.

SUMMARY

Some embodiments of the present disclosure provide a substrate processing apparatus capable of reducing gas consumption and performing uniform deposition and a substrate processing method using the same.

Some embodiments of the present disclosure provide a substrate processing apparatus capable of not increasing a total process time and a substrate processing method using the same.

Some embodiments of the present disclosure provide a substrate processing apparatus capable of simplifying equipment and a substrate processing method using the same.

Some embodiments of the present disclosure concept provide a substrate processing apparatus capable of preventing the occurrence of particles to reduce contamination of a substrate and a substrate processing method using the same.

According to embodiments of the present disclosure, a substrate processing method is provided and includes: placing a first substrate on a first stage in a process chamber of a substrate processing apparatus; placing a second substrate on a second stage in the process chamber, the second stage spaced apart in at least one horizontal direction from the first stage; performing a first deposition process on the first substrate; and performing a second deposition process on the second substrate, wherein the performing the first deposition process includes supplying the first substrate with a first gas, wherein the performing the second deposition process includes supplying the second substrate with a second gas different from the first gas, wherein the supplying the first substrate with the first gas includes alternately and repeatedly performing steps of: filling a first gas supply unit of the substrate processing apparatus with the first gas for a first time length, the first gas supply unit being upwardly spaced apart from the first stage; and supplying the first substrate with the first gas, that is in the first gas supply unit, for a second time length, and wherein the second time length is greater than the first time length.

According to embodiments of the present disclosure, a substrate processing method is provided and includes: forming a seed layer on a first substrate on a first stage in a process chamber; moving the first substrate having the seed layer to a second stage in the process chamber; and forming a bulk layer on the first substrate on the second stage, wherein forming the seed layer on the first substrate includes supplying the first substrate with a first gas in a first pulse, and wherein the forming the bulk layer on the first substrate includes supplying the first substrate with a second gas in a second pulse. The supplying the first substrate with the first gas in the first pulse includes: filling, with the first gas, a first gas supply unit upwardly spaced apart from the first stage, the first gas reaching a first pressure; and supplying the first substrate with the first gas introduced into the first gas supply unit. The supplying the first substrate with the second gas in the second pulse includes: filling, with the second gas, a second gas supply unit upwardly spaced apart from the second stage, the second gas reaching a second pressure; and supplying the first substrate with the second gas introduced into the second gas supply unit, wherein the first pressure is less than the second pressure.

According to embodiments of the present disclosure, a substrate processing apparatus is provided and includes: a process chamber that includes a process space; a first stage in the process space; a second stage in the process space and spaced apart in at least one horizontal direction from the first stage; a first showerhead upwardly spaced apart from the first stage; a second showerhead upwardly spaced apart from the second stage; a first gas supply unit connected to a first distribution space on the first showerhead; and a second gas supply unit connected to a second distribution space on the second showerhead. The first gas supply unit includes: a first gas tank; a first supply line that connects the first gas tank to the first distribution space; a first mass flow controller (MFC) on the first supply line; and a first valve on the first supply line and between the first MFC and the first distribution space. The second gas supply unit includes: a second gas tank; a second supply line that connects the second gas tank to the second distribution space; a second MFC on the second supply line; a second valve on the second supply line and between the second MFC and the second distribution space; and a charge tank on the second supply line between the second MFC and the second valve, wherein no charge tank is between the first MFC and the first valve.

Aspects of embodiments of the present disclosure are not limited to the mentioned above, and other aspects which have not been mentioned above will be clearly understood to those skilled in the art from the following description.

Details of other example embodiments are included in the below description and drawings.

DETAILED DESCRIPTION

Figure 1:
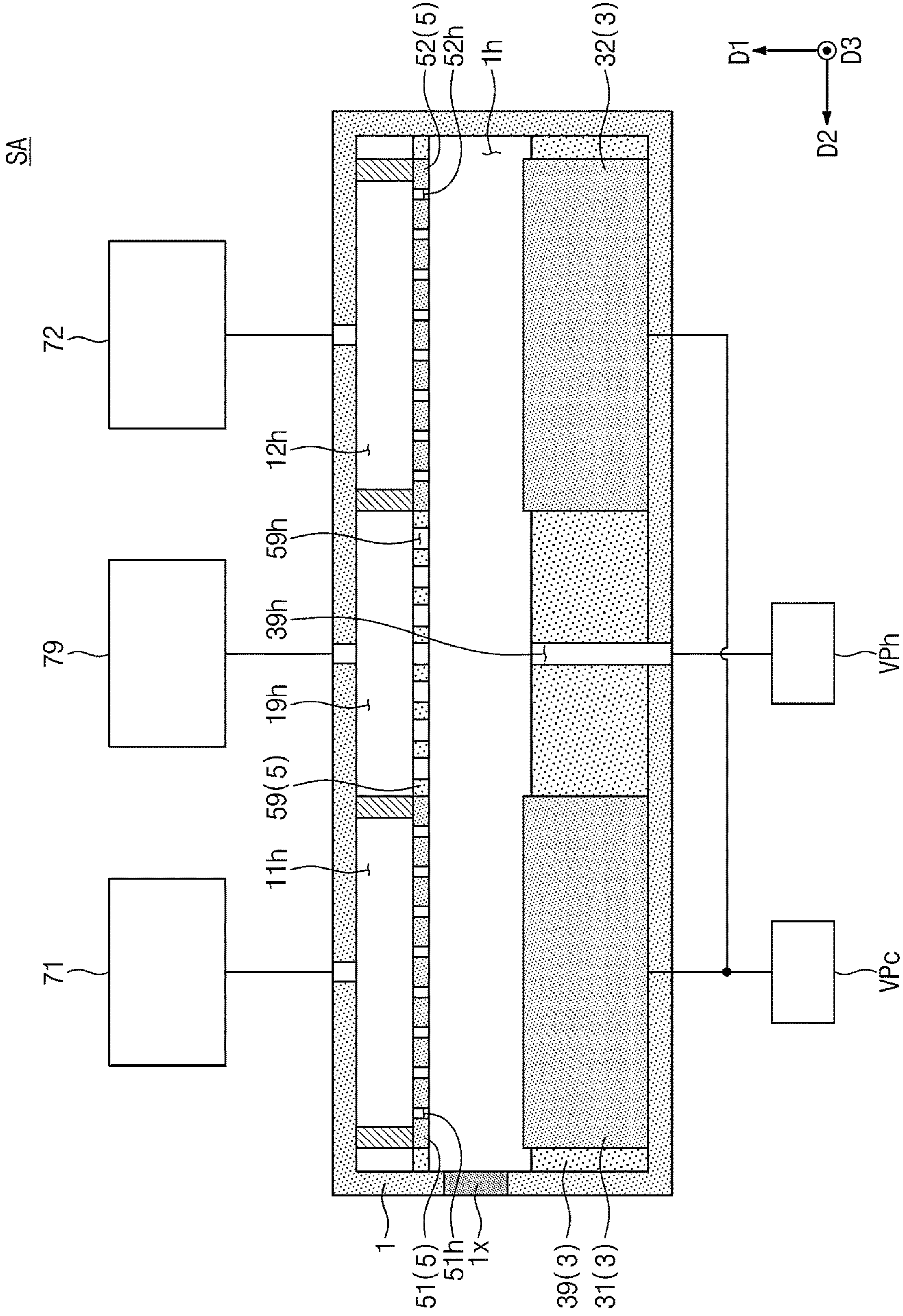
FIG. 1 illustrates a cross-sectional view showing a substrate processing apparatus according to some embodiments of the present disclosure.

The following describes some non-limiting example embodiments of the present disclosure with reference to the accompanying drawings. Like reference numerals may indicate like components throughout the description.

It will be understood that when an element or layer is referred to as being "on," "connected to," or "coupled to" another element or layer, it can be directly on, connected to, or coupled to the other element or layer or intervening elements or layers may be present. In contrast, when an element or layer is referred to as being "directly on," "directly connected to," or "directly coupled to" another element or layer, there are no intervening elements or layers present.

FIG. 1 illustrates a cross-sectional view showing a substrate processing apparatus according to some embodiments of the present disclosure.

In this description, a first direction D1, a second direction D2 that intersects the first direction D1, and a third direction D3 that intersects each of the first direction D1 and the second direction D2 are described. The first direction D1 may be called a vertical direction. Each of the second direction D2 and the third direction D3 may be called a horizontal direction.

Referring to FIG. 1, a substrate processing apparatus SA may be provided. The substrate processing apparatus SA may be a device for performing a deposition process on a substrate. For example, the substrate processing apparatus SA may deposit a tungsten-containing layer on a substrate. A single substrate processing apparatus SA may sequentially deposit a plurality of layers on one substrate. For example, the substrate processing apparatus SA may sequentially deposit a seed layer and a bulk layer on a substrate. The seed layer may include, for example, diborane ($B_2H_6$) and tungsten hexafluoride ($WF_6$). Diborane ($B_2H_6$) may be a precursor to deposit tungsten hexafluoride ($WF_6$). The bulk layer may include, for example, hydrogen ($H_2$) and tungsten hexafluoride ($WF_6$). The bulk layer may be deposited on the seed layer. Embodiments of the present disclosure, however, are not limited thereto, and the substrate processing apparatus SA may perform other kinds of deposition processes. The substrate processing apparatus SA may simultaneously perform a plurality of deposition processes. The substrate processing apparatus SA may include a process chamber 1, a stage assembly 3, a showerhead assembly 5, a first gas supply unit 71, a second gas supply unit 72, a shield gas supply unit 79, a main vacuum pump VPh, and a fixed vacuum pump VPc.

The process chamber 1 may provide a process space 1*h*. A door 1*x* may separate the process space 1*h* from an external space. While a process is performed on a substrate, a pressure of the process space 1*h* may substantially reach a vacuum pressure. The process space 1*h* may be divided by the showerhead assembly 5. A detailed description thereof will be provided below.

The stage assembly 3 may be positioned in the process space 1*h*. The stage assembly 3 may support a plurality of substrates. The stage assembly 3 may include a first stage 31, a second stage 32, a third stage 33 (see FIG. 2), a fourth stage 34 (see FIG. 2), and a main stage 39. The stage assembly 3 will be further discussed in detail below with reference to FIG. 2.

The showerhead assembly 5 may be positioned in the process space 1*h*. The showerhead assembly 5 may be disposed such as to be upwardly spaced apart from the stage assembly 3. The showerhead assembly 5 may uniformly distribute a gas. The showerhead assembly 5 may include a first showerhead 51, a second showerhead 52, a third showerhead 53 (see FIG. 3), a fourth showerhead 54 (see FIG. 3), and a main showerhead 59. The showerhead assembly 5 will be further discussed in detail below with reference to FIG. 3.

The first gas supply unit 71 may be connected to the process chamber 1. The first gas supply unit 71 may supply a gas to the first showerhead 51. For example, the first gas supply unit 71 may supply a first gas and a third gas. A detailed description thereof will be provided below.

The second gas supply unit 72 may be connected to the process chamber 1. The second gas supply unit 72 may supply a gas to the second showerhead 52, the third showerhead 53 (see FIG. 3), and the fourth showerhead 54 (see FIG. 3). For example, the second gas supply unit 72 may supply a second gas and a fourth gas. A detailed description thereof will be provided below.

The shield gas supply unit 79 may be connected to the process chamber 1. The shield gas supply unit 79 may supply a gas to the main showerhead 59. For example, the shield gas supply unit 79 may supply a shield gas. A detailed description thereof will be provided below.

The main vacuum pump VPh may be connected to the process space 1*h*. The main vacuum pump VPh may apply a vacuum pressure to the process space 1*h*. The main vacuum pump VPh may apply a vacuum pressure to an entire surface on the stage assembly 3. For example, the main vacuum pump VPh may apply a vacuum pressure to a space on each of the first stage 31, the second stage 32, the third stage 33 (see FIG. 2), and the fourth stage 34 (see FIG. 2). A detailed description thereof will be provided below.

Figure 2:
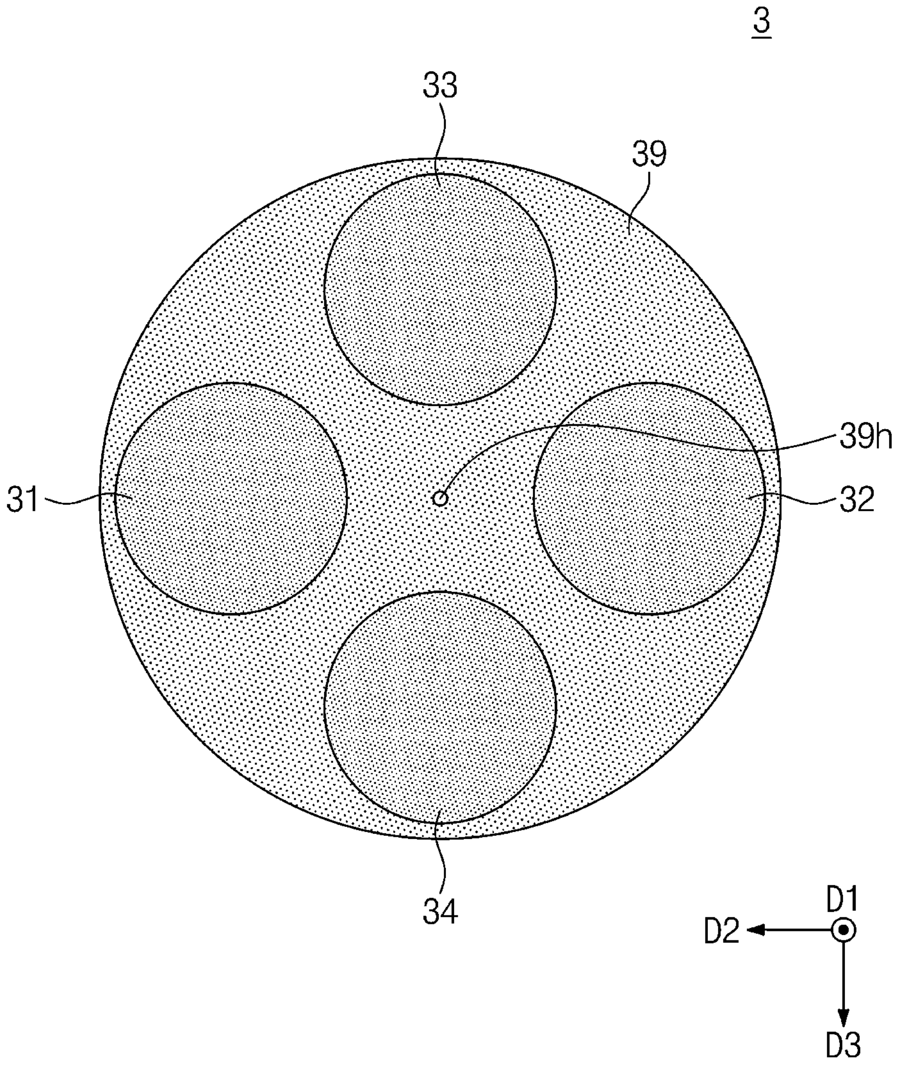
FIG. 2 illustrates a plan view showing a stage assembly according to some embodiments of the present disclosure.

The fixed vacuum pump VPc may be connected to each of the first stage 31, the second stage 32, the third stage 33 (see FIG. 2) and the fourth stage 34 (see FIG. 2). The fixed vacuum pump VPc may apply a vacuum pressure to each of the first stage 31, the second stage 32, the third stage 33 (see FIG. 2) and the fourth stage 34 (see FIG. 2).

FIG. 2 illustrates a plan view showing a stage assembly according to some embodiments of the present disclosure.

Referring to FIG. 2, the first stage 31 may support a substrate. The first stage 31 may use, for example, a vacuum pressure to rigidly place a substrate on a certain position. The first stage 31 may be connected to the fixed vacuum pump VPc. Embodiments of the present disclosure, however, are not limited thereto, and the first stage 31 may use other ways to rigidly place a substrate on a certain position. For example, the first stage 31 may be an electrostatic chuck (ESC) that uses an electrostatic force to fix a substrate. The first stage 31 may have a circular shape when viewed in plan. The first stage 31 may have a diameter of equal to or greater than about 300 mm.

The second stage 32 may be disposed such as to be spaced in the horizontal direction from the first stage 31. The second stage 32 may support a substrate. Similar to the first stage 31, the second stage 32 may use a vacuum pressure to rigidly place a substrate on a certain position, but embodiments of the present disclosure are not limited thereto.

The third stage 33 may be disposed such as to be spaced in the horizontal direction from the second stage 32. The third stage 33 may support a substrate. Similar to the first stage 31, the third stage 33 may use a vacuum pressure to rigidly place a substrate on a certain position, but embodiments of the present disclosure are not limited thereto.

The fourth stage 34 may be disposed such as to be spaced in the horizontal direction from the third stage 33. The fourth stage 34 may support a substrate. Similar to the first stage 31, the fourth stage 34 may use a vacuum pressure to rigidly place a substrate on a certain position, but embodiments of the present disclosure are not limited thereto.

The main stage 39 may support the first stage 31, the second stage 32, the third stage 33, and the fourth stage 34. The main stage 39 may surround the first stage 31, the second stage 32, the third stage 33, and the fourth stage 34. The main stage 39 may include a main vacuum hole 39*h*. The main vacuum hole 39*h* may be connected to the main vacuum pump Vph (see FIG. 1). The main vacuum pump VPh may be connected through the main vacuum hole 39*h* to the process space 1*h* (see FIG. 1).

Figure 3:
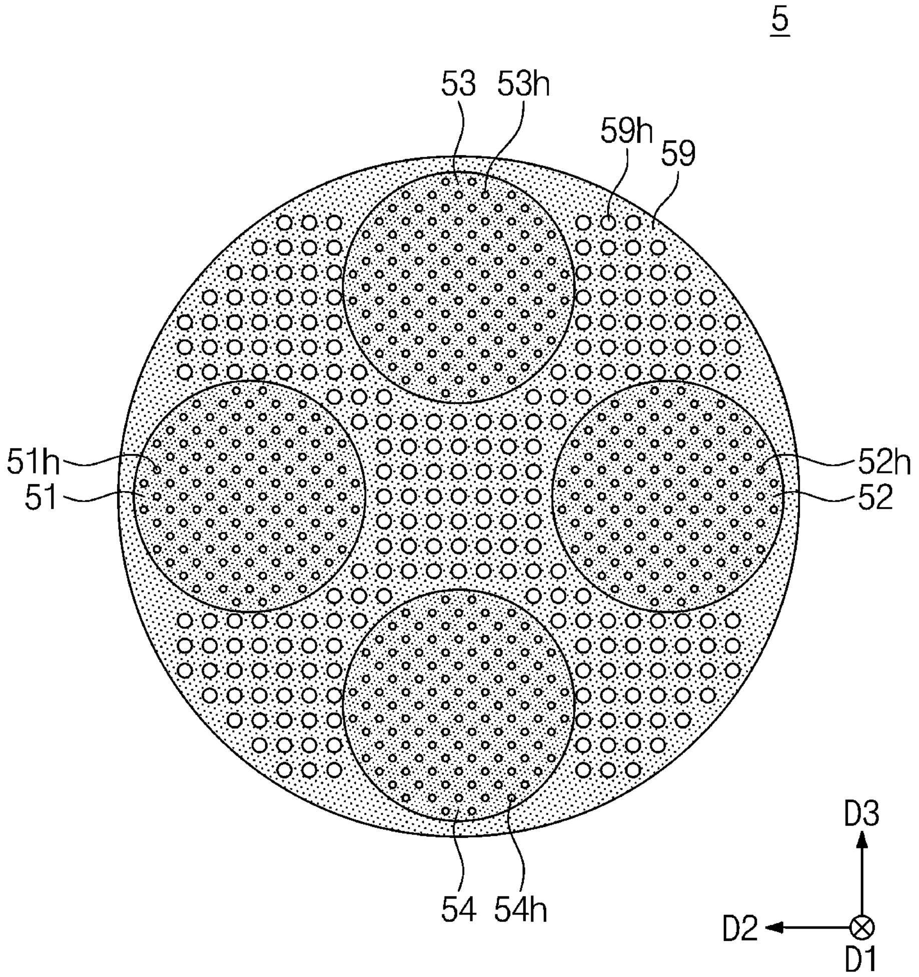
FIG. 3 illustrates a bottom view showing a showerhead assembly according to some embodiments of the present disclosure.

FIG. 3 illustrates a bottom view showing a showerhead assembly according to some embodiments of the present disclosure.

Referring to FIG. 3, the first showerhead 51 may include a first gas hole 51*h*. As shown in FIG. 1, the first gas hole 51*h* may penetrate in the first direction D1 through the first showerhead 51. The first showerhead 51 may be disposed such as to be upwardly spaced apart from the first stage 31 (see FIG. 1). The first showerhead 51 may have a circular shape when viewed in a plan view. The first showerhead 51 may divide the process space 1*h* (see FIG. 1). A space on a top surface of the first showerhead 51 may be called a first distribution space 11*h*. The first distribution space 11*h* may be connected to the first gas supply unit 71 (see FIG. 1).

The second showerhead 52 may include a second gas hole 52*h*. As shown in FIG. 1, the second gas hole 52*h* may penetrate in the first direction D1 through the second showerhead 52. The second showerhead 52 may be disposed such as to be upwardly spaced apart from the second stage 32 (see FIG. 1). The second showerhead 52 may be disposed such as to be spaced apart in the horizontal direction from the first showerhead 51. The second showerhead 52 may have a circular shape when viewed in a plan view. The second showerhead 52 may divide the process space 1*h* (see FIG. 2). A space on a top surface of the second showerhead 52 may be called a second distribution space 12*h*. The second distribution space 12*h* may be connected to the second gas supply unit 72 (see FIG. 1).

The third showerhead 53 may include a third gas hole 53*h*. The third gas hole 53*h* may penetrate in the first direction D1 through the third showerhead 53. The third showerhead 53 may be disposed such as to be upwardly spaced apart from the third stage 33 (see FIG. 2). The third showerhead 53 may be disposed such as to be spaced apart in the horizontal direction from the second showerhead 52. The third showerhead 53 may have a circular shape when viewed in a plan view. The third showerhead 53 may divide the process space 1*h* (see FIG. 1). A space on a top surface of the third showerhead 53 may be called a third distribution space. The third distribution space may be connected to the second gas supply unit 72 (see FIG. 1).

The fourth showerhead 54 may include a fourth gas hole 54*h*. The fourth gas hole 54*h* may penetrate in the first direction D1 through the fourth showerhead 54. The fourth showerhead 54 may be disposed such as to be upwardly spaced apart from the fourth stage 34 (see FIG. 2). The fourth showerhead 54 may be disposed such as to be spaced apart in the horizontal direction from the third showerhead 53. The fourth showerhead 54 may have a circular shape when viewed in a plan view. The fourth showerhead 54 may divide the process space 1*h* (see of FIG. 1). A space on a top surface of the fourth showerhead 54 may be called a fourth distribution space. The fourth distribution space may be connected to the second gas supply unit 72 (see FIG. 1).

The main showerhead 59 may include a shield gas hole 59*h*. The shield gas hole 59*h* may penetrate in the first direction D1 through the main showerhead 59. The main showerhead 59 may surround the first showerhead 51, the second showerhead 52, the third showerhead 53, and the fourth showerhead 54. A circumference of the main showerhead 59 may have a circular shape when viewed in a plan view, but embodiments of the present disclosure are not limited thereto. The main showerhead 59 may divide the process space 1*h* (see FIG. 1). A space on a top surface of the main showerhead 59 may be called a shield distribution space 19*h* (see FIG. 1). The shield distribution space 19*h* may be connected to the shield gas supply unit 79.

Figure 4:
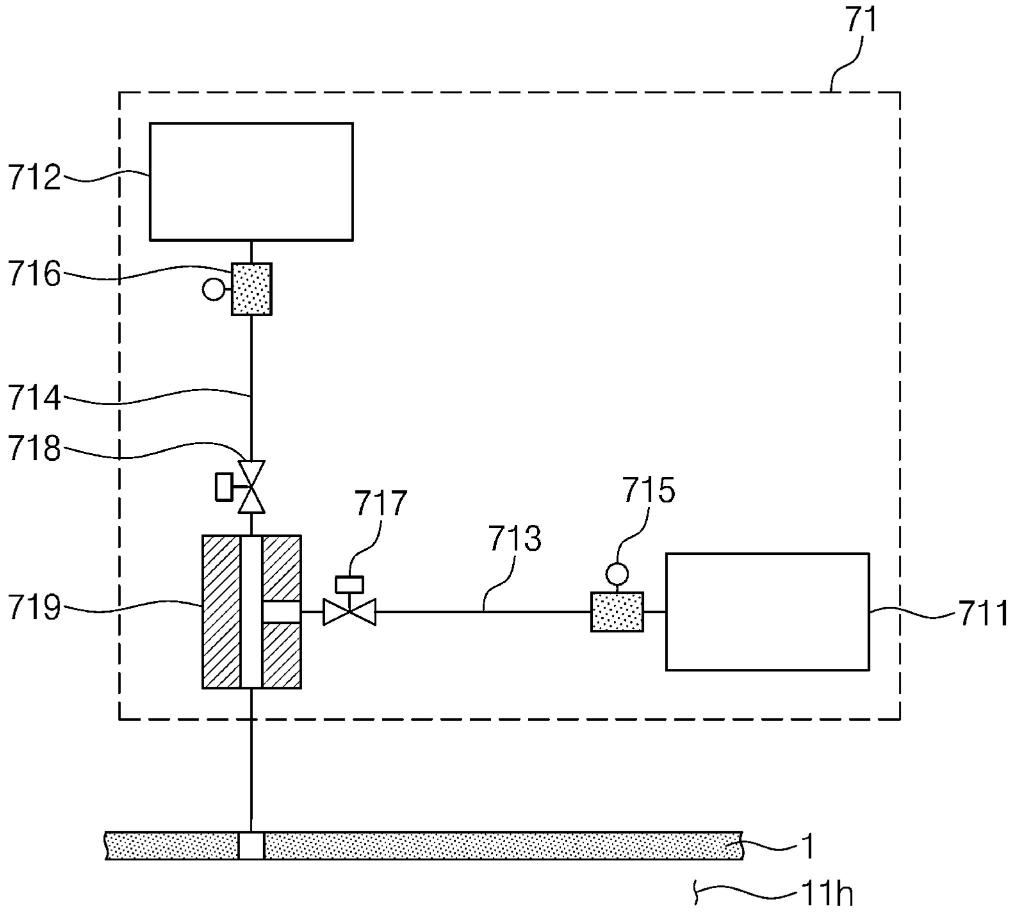
FIG. 4 illustrates a schematic diagram showing a first gas supply unit according to some embodiments of the present disclosure.

FIG. 4 illustrates a schematic diagram showing a first gas supply unit according to some embodiments of the present disclosure.

Referring to FIG. 4, the first gas supply unit 71 may be connected to the first distribution space 11*h* of the process chamber 1. The first gas supply unit 71 may supply the first distribution space 11*h* with the first gas and the third gas. The first gas supply unit 71 may include a first gas tank 711, a first supply line 713, a first mass flow controller (MFC) 715, a first valve 717, a third gas tank 712, a third supply line 714, a third MFC 716, a third valve 718, and a first connection unit 719.

The first gas tank 711 may store the first gas. The first gas stored in the first gas tank 711 may be, for example, diborane ($B_2H_6$). The first gas stored in the first gas tank 711 may be supplied through the first supply line 713 to the process chamber 1.

The first supply line 713 may connect the first gas tank 711 and the process chamber 1 to each other. The first gas may move along the first supply line 713 toward the process chamber 1.

The first MFC 715 may be positioned on the first supply line 713. The first MFC 715 may control a flow rate of gas that flows through the first supply line 713.

The first valve 717 may be positioned on the first supply line 713. The first valve 717 may be positioned between the first MFC 715 and the process chamber 1. The first valve 717 may selectively close a flow of gas that flows through the first supply line 713. The first valve 717 may be an automatic valve, but embodiments of the present disclosure are not limited thereto.

No charge tank may be provided between the first MFC 715 and the first valve 717. For example, the first MFC 715 and the first valve 717 may be connected to each other only through the first supply line 713. A detailed description thereof will be provided below.

The third gas tank 712 may store the third gas. The third gas stored in the third gas tank 712 may be, for example, tungsten hexafluoride ($WF_6$). The third gas stored in the third gas tank 712 may be supplied through the third supply line 714 to the process chamber 1.

The third supply line 714 may connect the third gas tank 712 and the process chamber 1 to each other. The third gas may move along the third supply line 714 toward the process chamber 1.

The third MFC 716 may be positioned on the third supply line 714. The third MFC 716 may control a flow rate of gas that flows through the third supply line 714.

The third valve 718 may be positioned on the third supply line 714. The third valve 718 may be positioned between the third MFC 716 and the process chamber 1. The third valve 718 may selectively close a flow of gas that flows through the third supply line 714. The third valve 718 may be an automatic valve, but embodiments of the present disclosure are not limited thereto.

The first connection unit 719 may be positioned between the process chamber 1 and each of the first valve 717 and the third valve 718. Each of the first supply line 713 and the third supply line 714 may be connected through the first connection unit 719 to the process chamber 1.

Figure 5:
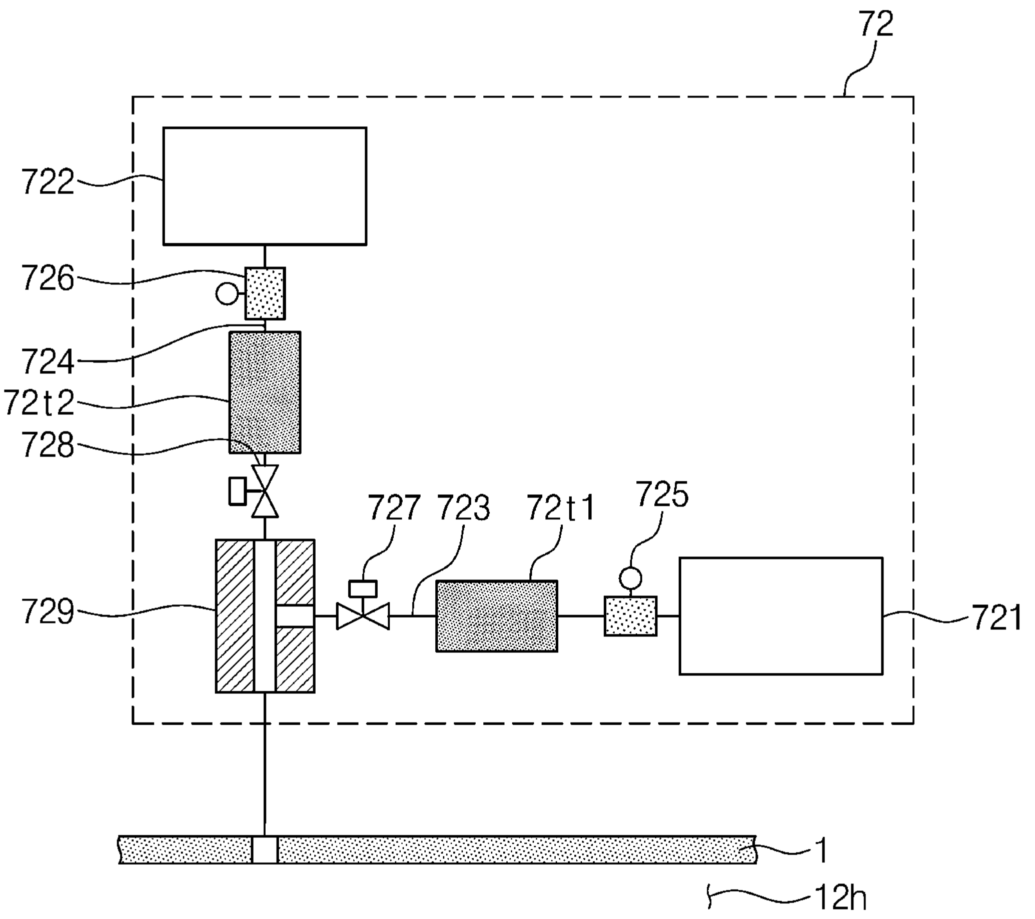
FIG. 5 illustrates a schematic diagram showing a second gas supply unit according to some embodiments of the present disclosure.

FIG. 5 illustrates a schematic diagram showing a second gas supply unit according to some embodiments of the present disclosure.

Referring to FIG. 5, the second gas supply unit 72 may be connected to the second distribution space **12*h* of the process chamber 1. The second gas supply unit 72 may supply the second distribution space 12*h* with the second gas and the fourth gas. The second gas supply unit 72 may include a second gas tank 721, a second supply line 723, a second MFC 725, a second valve 727, a fourth gas tank 722, a fourth supply line 724, a fourth MFC 726, a fourth valve 728, and a second connection unit 729. The second gas supply unit 72 may further include a first charge tank 72*t*1 and a second charge tank 72*t*2**.

The second gas tank 721 may store the second gas. The second gas stored in the second gas tank 721 may include, for example, hydrogen ($H_2$). The second gas stored in the second gas tank 721 may be supplied through the second supply line 723 to the process chamber 1.

The second supply line 723 may connect the second gas tank 721 and the process chamber 1 to each other. The second gas may move along the second supply line 723 toward the process chamber 1.

The second MFC 725 may be positioned on the second supply line 723. The second MFC 725 may control a flow rate of gas that flows through the second supply line 723.

The second valve 727 may be positioned on the second supply line 723. The second valve 727 may be positioned between the second MFC 725 and the process chamber 1. The second valve 727 may selectively close a flow of gas that flows through the second supply line 723. The second valve 727 may be an automatic valve, but embodiments of the present disclosure are not limited thereto.

The first charge tank **72*t*1 may be positioned between the second MFC 725 and the second valve 727. For example, the first charge tank 72*t*1 may be positioned on the second supply line 723 between the second MFC 725 and the second valve 727. The first charge tank 72*t*1** may temporarily store the second gas. A detailed description thereof will be provided below.

The fourth gas tank 722 may store the fourth gas. The fourth gas stored in the fourth gas tank 722 may be, for example, tungsten hexafluoride ($WF_6$). The fourth gas stored in the fourth gas tank 722 may be supplied through the fourth supply line 724 to the process chamber 1.

The fourth supply line 724 may connect the fourth gas tank 722 and the process chamber 1 to each other. The fourth gas may move along the fourth supply line 724 toward the process chamber 1.

The fourth MFC 726 may be positioned on the fourth supply line 724. The fourth MFC 726 may control a flow rate of gas that flows through the fourth supply line 724.

The fourth valve 728 may be positioned on the fourth supply line 724. The fourth valve 728 may be positioned between the fourth MFC 726 and the process chamber 1. The fourth valve 728 may selectively close a flow of gas that flows through the fourth supply line 724. The fourth valve 728 may be an automatic valve, but embodiments of the present disclosure are not limited thereto.

The second charge tank **72*t*2 may be positioned between the fourth MFC 726 and the fourth valve 728. For example, the second charge tank 72*t*2 may be positioned on the fourth supply line 724 between the fourth MFC 726 and the fourth valve 728. The second charge tank 72*t*2** may temporarily store the fourth gas. A detailed description thereof will be provided below.

The second connection unit 729 may be positioned between the process chamber 1 and each of the second valve 727 and the fourth valve 728. Each of the second supply line 723 and the fourth supply line 724 may be connected through the second connection unit 729 to the process chamber 1.

Figure 6:
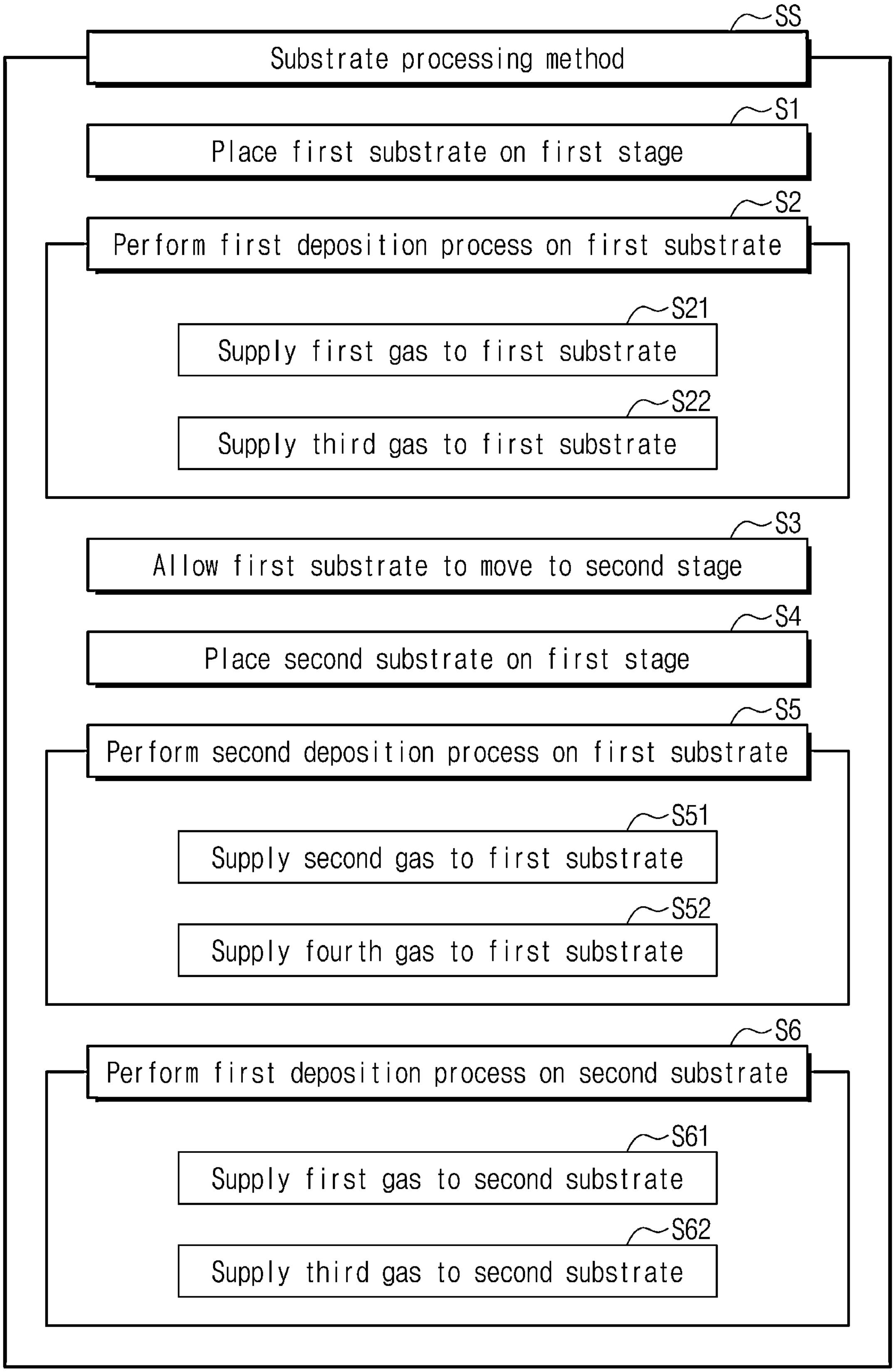
FIG. 6 illustrates a flow chart showing a substrate processing method according to some embodiments of the present disclosure.

FIG. 6 illustrates a flow chart showing a substrate processing method according to some embodiments of the present disclosure.

Referring to FIG. 6, a substrate processing method SS may be provided. The substrate processing method SS may be a way of processing a substrate by using the substrate processing apparatus SA discussed with reference to FIGS. 1 to 5. The substrate processing method SS may include placing a first substrate on a first stage (operation S1), performing a first deposition process on the first substrate (operation S2), allowing the first substrate to move to a second stage (operation S3), placing a second substrate on the first stage (operation S4), performing a second deposition process on the first substrate (operation S5), and performing the first deposition process on the second substrate (operation S6).

The operation S2 of performing the first deposition process on the first substrate may include forming a seed layer on the first substrate. The first deposition process may form the seed layer on the first substrate. For example, the operation S2 of performing the first deposition process on the first substrate may be a stage of forming the seed layer on the first substrate. The operation S2 of performing the first deposition process on the first substrate may include supplying a first gas to the first substrate (operation S21) and supplying a third gas to the first substrate (operation S22).

The operation S5 of performing the second deposition process on the first substrate may include forming a bulk layer on the first substrate. The second deposition process may form the bulk layer on the first substrate. For example, the operation S5 of performing the second deposition process on the first substrate may be a step of forming the bulk layer on the first substrate. The operation S5 of performing the second deposition process on the first substrate may include supplying a second gas to the first substrate (operation S51) and supplying a fourth gas to the first substrate (operation S52).

The operation S6 of performing the first deposition process on the second substrate may include supplying the first gas to the second substrate (operation S61) and supplying the third gas to the second gas (operation S62).

FIGS. 7 to 21 illustrate diagrams showing a substrate processing method according to the flow chart of FIG. 6.

Figure 7:
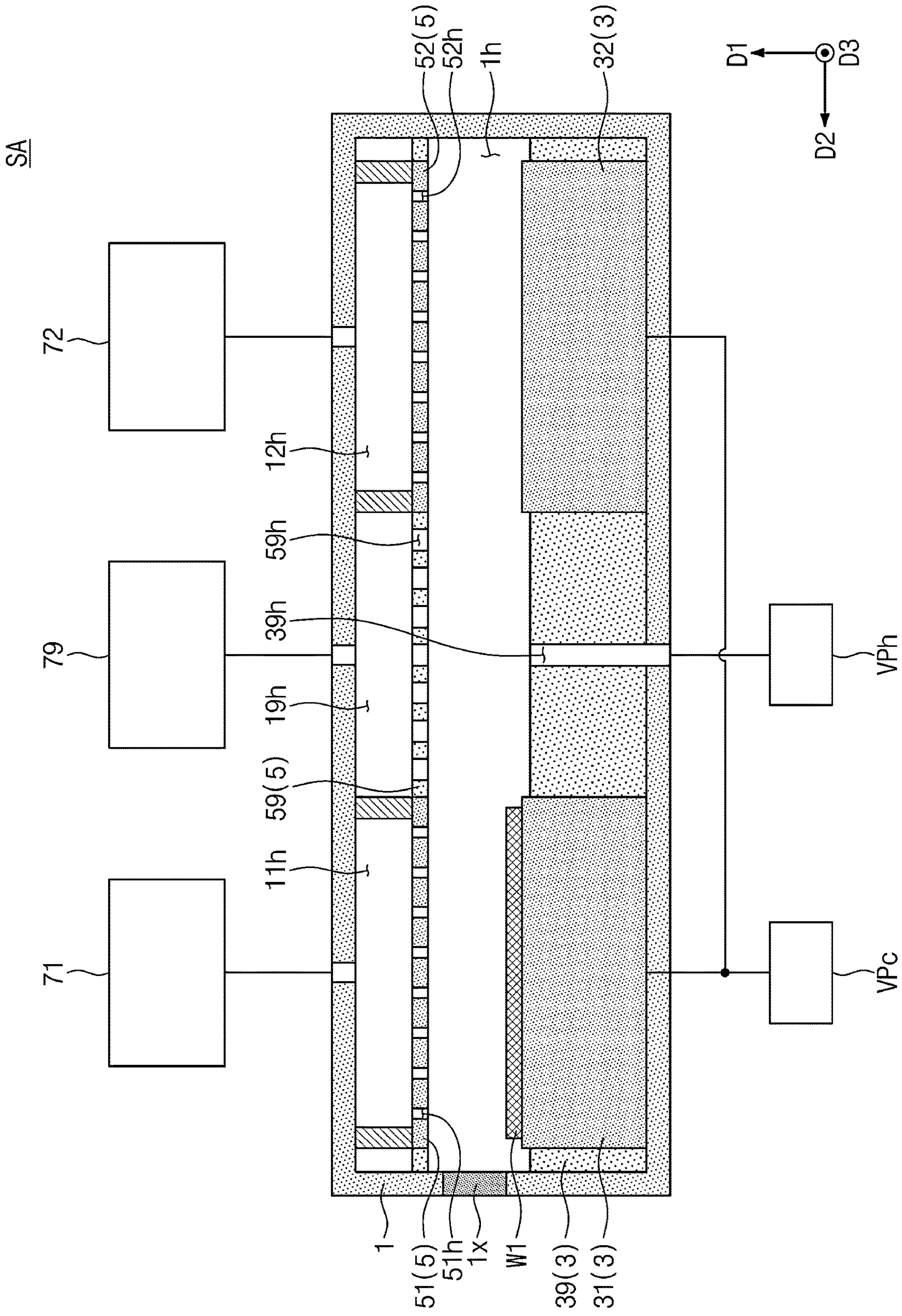
FIGS. 7 to 21 illustrate diagrams showing a substrate processing method according to the flow chart of FIG. 6.
Figure 8:
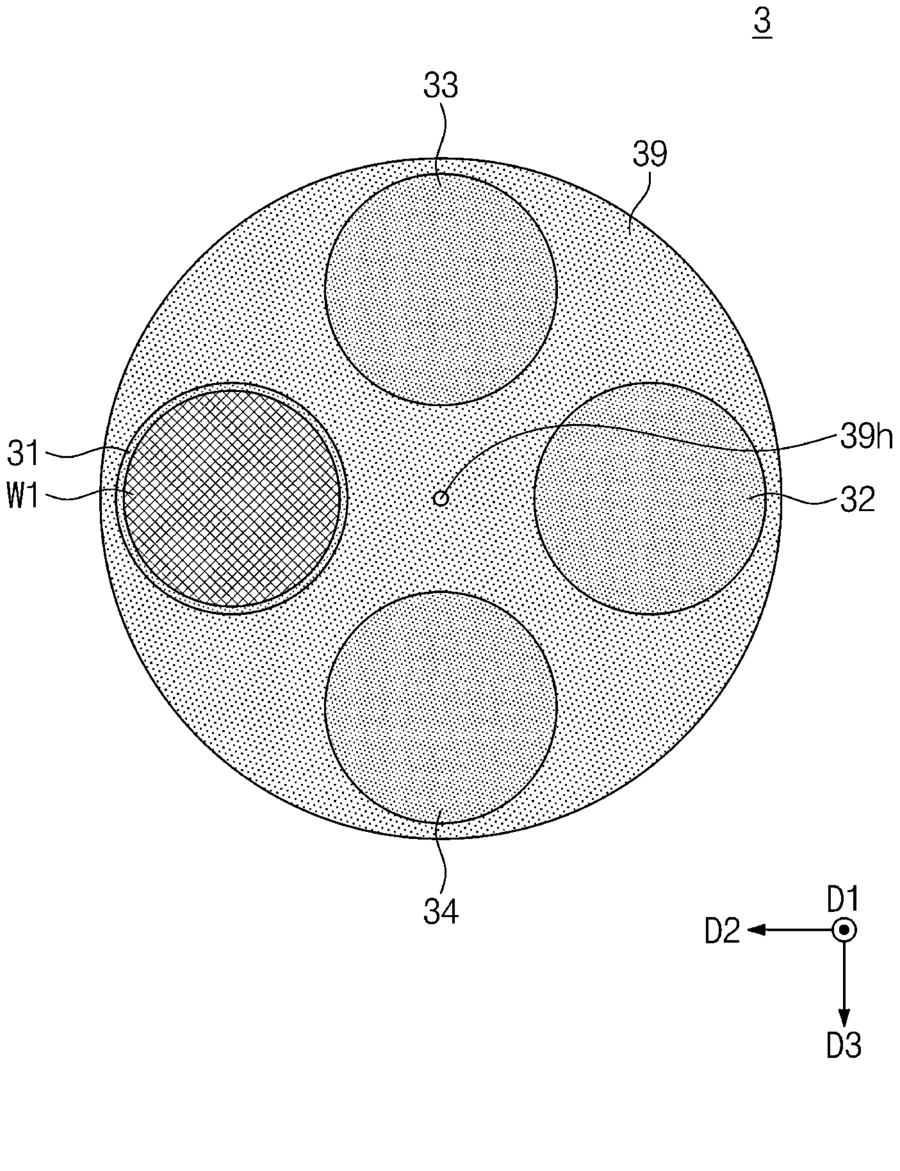

Referring to FIGS. 6, 7, and 8, the operation S1 of placing the first substrate on the first stage may include allowing the first stage 31 to receive fixedly thereon a first substrate W1 inserted into the process chamber 1. For example, the first stage 31 may use a vacuum pressure provided from the fixed vacuum pump VPc to rigidly place the first substrate W1 at a certain position. The first substrate W1 may be a silicon wafer, but embodiments of the present disclosure are not limited thereto. In this procedure, each of the second stage 32, the third stage 33, and the fourth stage 34 may be in an empty state. For example, as shown in FIG. 8, no substrate may be disposed on each of the second stage 32, the third stage 33, and the fourth stage 34. Embodiments of the present disclosure, however, are not limited thereto, and when the first substrate W1 is disposed on the first stage 31, another substrate may be disposed on each of the second stage 32, the third stage 33, and the fourth stage 34.

Figure 9:
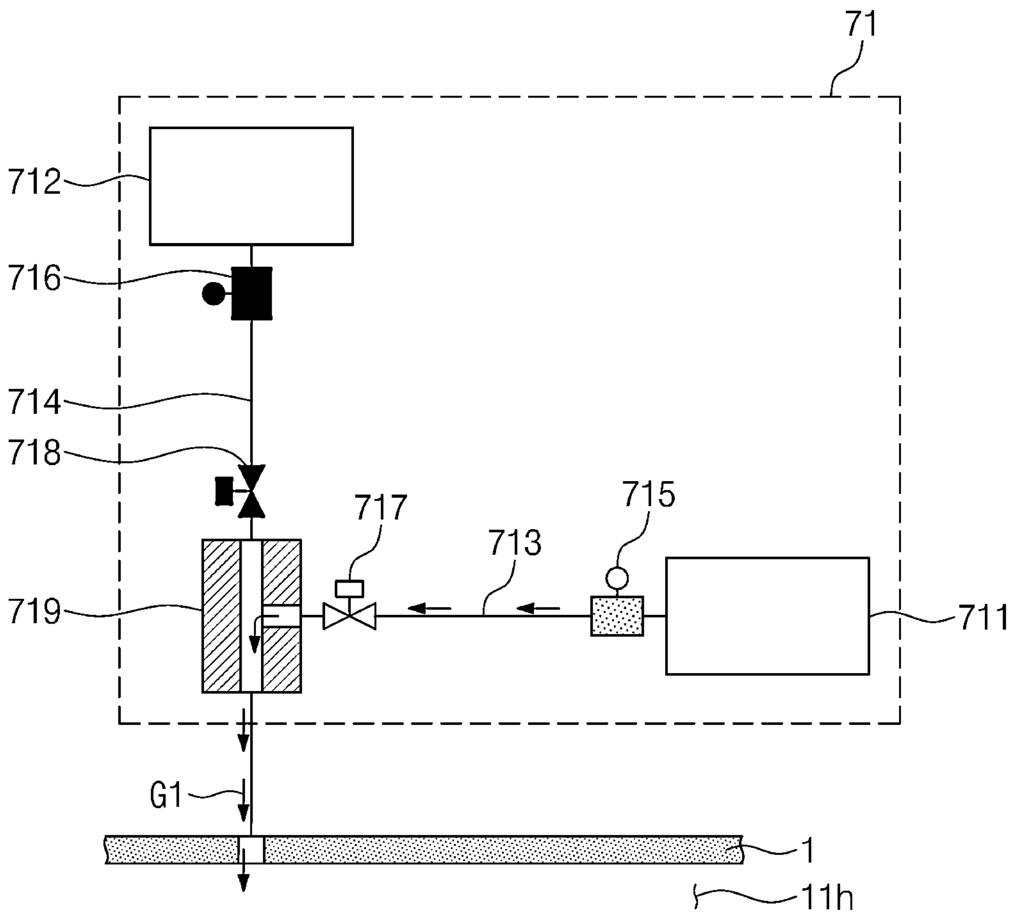
Figure 10:
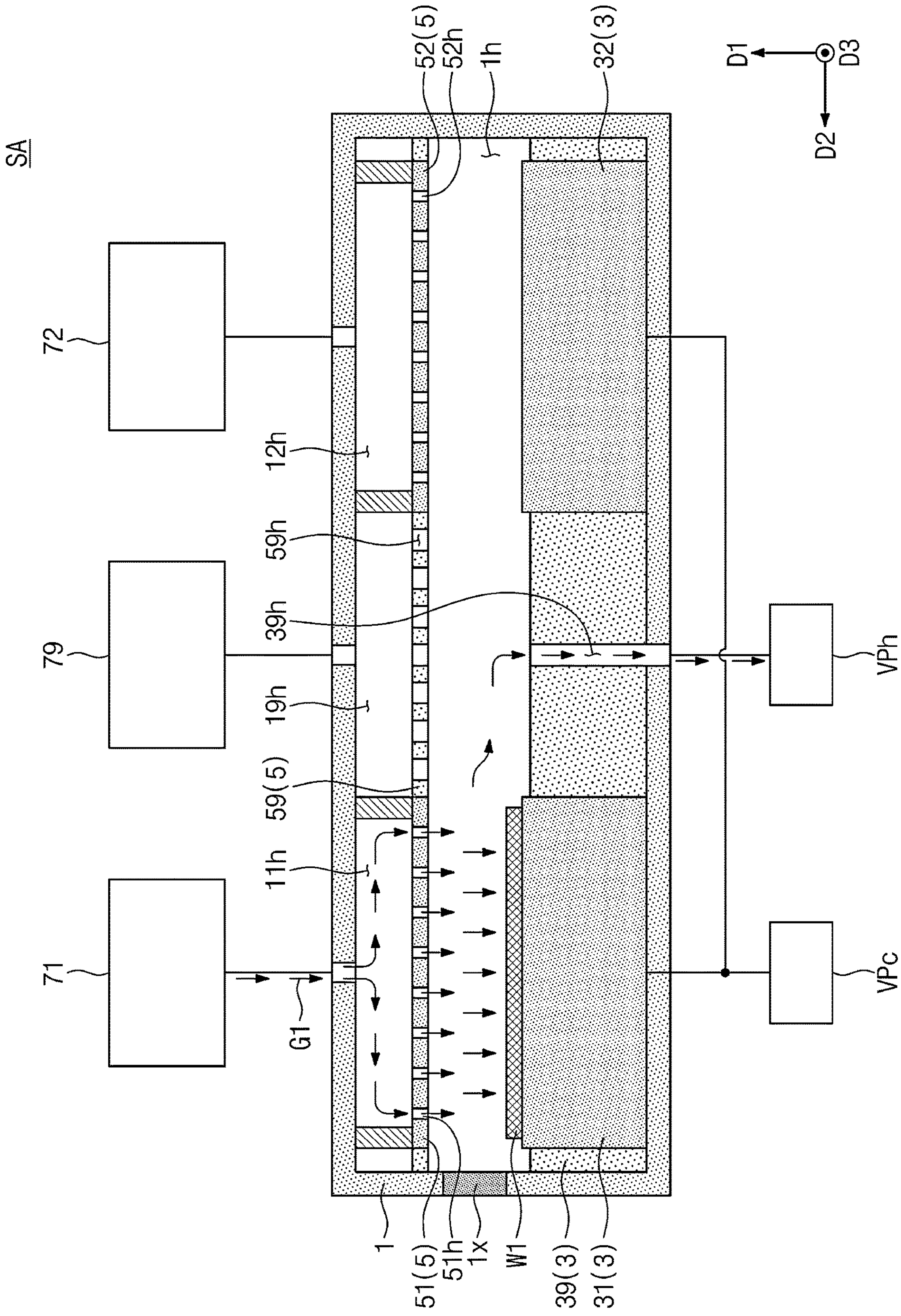

Referring to FIGS. 6, 9, and 10, the operation S21 of supplying the first gas to the first substrate may include allowing a first gas G1 supplied from the first gas tank 711 to be sprayed through the first supply line 713 into the first distribution space 11*h* of the process chamber 1. The first gas G1 may sequentially pass through the first MFC 715 and the first valve 717. In this procedure, no gas may be supplied from the third gas tank 712 to the process chamber 1. The third valve 718 may be in a closed state. The first gas G1 sprayed into the first distribution space 11*h* may be supplied through the first showerhead 51 to the first substrate W1. A portion of the first gas G1 may be deposited on the first substrate W1, and another portion of the first gas G1 may be outwardly discharged through the main vacuum pump VPh away from the process space 1*h*.

Figure 11:
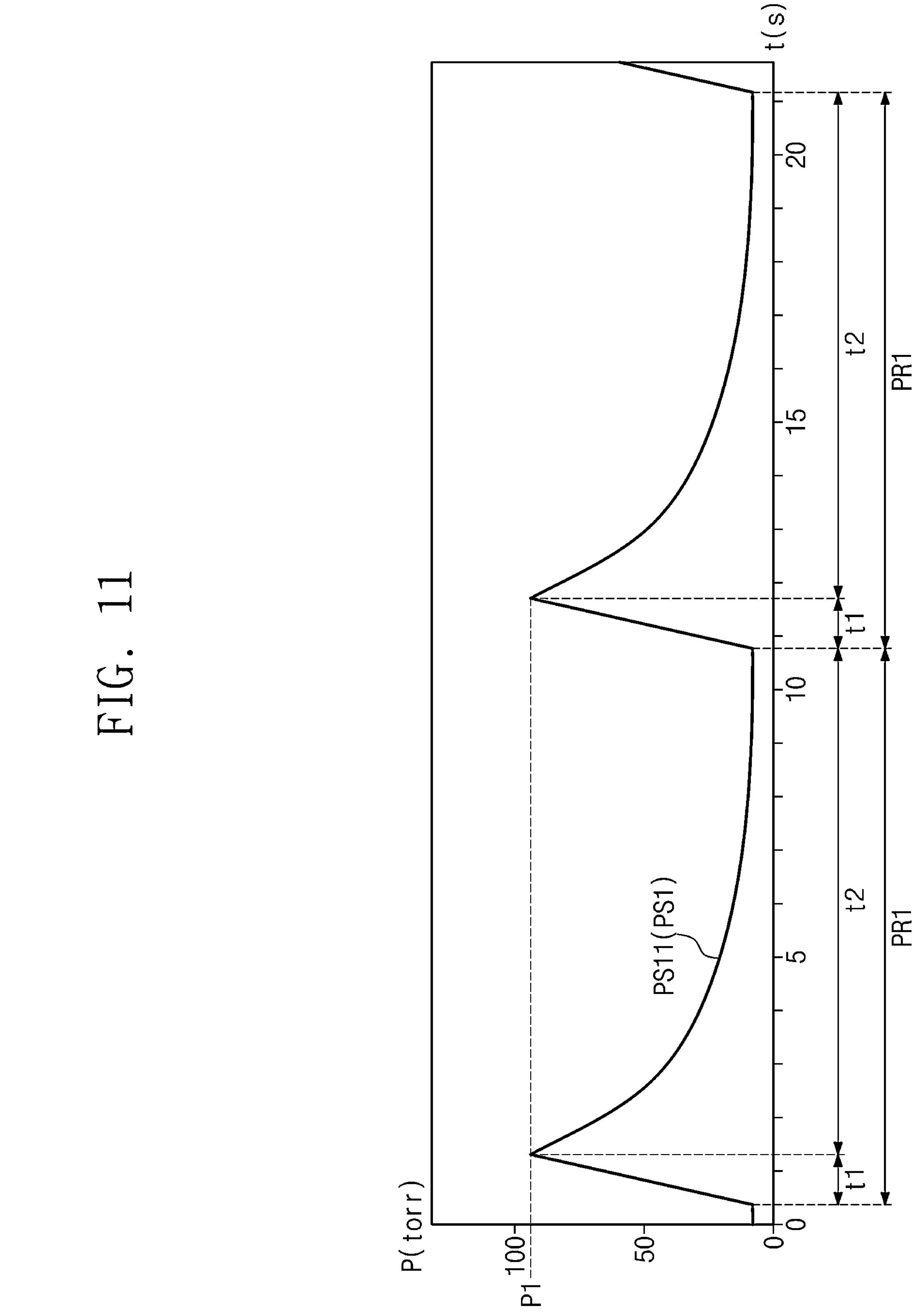

Referring to FIG. 11, a horizontal axis may indicate time. A unit of the horizontal axis may be seconds. A vertical axis may indicate pressure. For example, the vertical axis may refer to a pressure in the first supply line 713 (see FIG. 9) positioned between the first valve 717 (see FIG. 9) and the first MFC 715 (see FIG. 9). The vertical axis of FIG. 11 may refer to a pressure of the first gas (see G1 of FIG. 9) in the first supply line 713. A unit of the vertical axis may be Torr.

Figure 12:
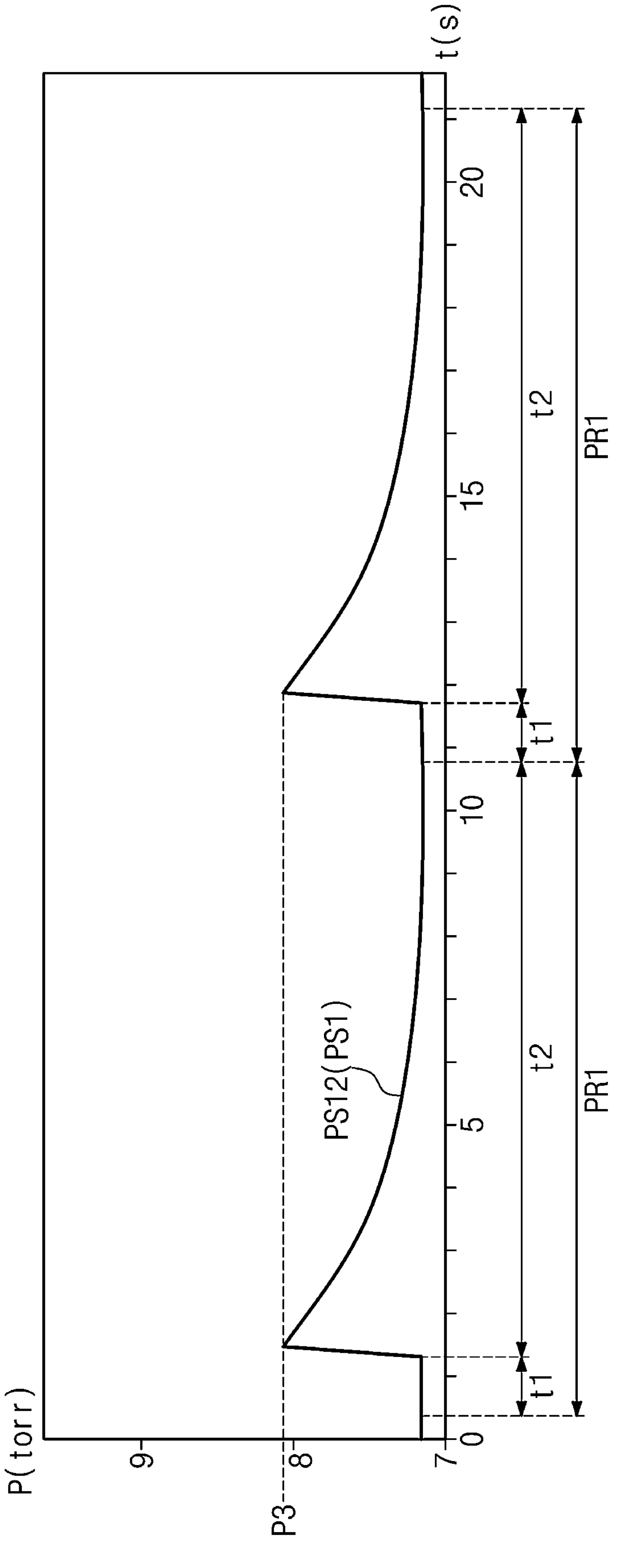

Referring to FIG. 12, a horizontal axis may indicate time. A unit of the horizontal axis may be seconds. A vertical axis may indicate pressure. For example, the vertical axis may refer to a pressure in the first distribution space 11*h* (see FIG. 9). The vertical axis of FIG. 12 may refer to a pressure of the first gas G1 (see FIG. 9) in the first distribution space 11*h*. A unit of the vertical axis may be Torr.

Referring to FIGS. 6, 11, and 12, the operation S21 of supplying the first gas to the first substrate may include supplying the first substrate W1 with the first gas G1 in a first pulse PS1. For example, the first gas G1 may be supplied in the form of the first pulse PS1. For example, the operation S21 of supplying the first gas to the first substrate may include filling the first gas supply unit 71 (see FIG. 9) with the first gas G1 for a first time length t1 and supplying the first substrate W1 with the first gas G1, from the filled first gas supply unit 71, for a second time length t2. A pressure, depicted in FIG. 11, in the first supply line 713 (see FIG. 9) positioned between the first valve 717 (see FIG. 9) and the first MFC 715 (see FIG. 9) may have a form of a 1-1st pulse PS11. A pressure, depicted in FIG. 12, in the first distribution space 11*h* (see FIG. 9) may have a form of a 1-2nd pulse PS12. The form of the 1-2nd pulse PS2 may depend on the form of the 1-1st pulse PS11.

Referring to FIGS. 6, 9, 10, 11, and 12, the first pulse PS1 may be formed, for example, by the first valve 717. For example, when the first valve 717 is closed for the first time length t1, the first gas G1 may fill the first supply line 713 positioned between the first valve 717 and the first MFC 715. Therefore, the first gas G1 may have an increased pressure in the first supply line 713. For example, when the first valve 717 is closed for the first time length t1, a pressure of the first gas G1 in the first supply line 713 may increase to a first pressure P1. The first pressure P1 may be equal to or less than about 100 Torr. For example, the first pressure P1 may be less than about 100 Torr and greater than about 30 Torr. The first time length t1 may range from about 0.1 second to about 1 second. After the first time length t1 elapses, the first valve 717 may be opened. Therefore, the first gas G1 in the first supply line 713 may be sprayed through the first distribution space 11*h* onto the first substrate W1. In this procedure, a pressure of the first distribution space 11*h* may reach up to a third pressure P3. The third pressure P3 may range from about 7.5 Torr to about 10 Torr. For example, the first gas G1 introduced into the process chamber 1 may have a maximum pressure of equal to or less than about 10 Torr. The first substrate W1 may be provided with the first gas G1 for the second time length t2. The second time length t2 may be greater than the first time length t1. For example, a supplying time of the first gas G1 may be greater than a charging time of the first gas G1. The second time length t2 may range from about 8 seconds to about 12 seconds. The elapse of the second time length t2 may cause a slow reduction in pressure of the first distribution space 11*h*. A sum of the first time length t1 and the second time length t2 may be called a first period PR1. The first period PR1 may be a period of the first pulse PS1. The first period PR1 may range from about 9 seconds to about 13 seconds, but embodiments of the present disclosure are not limited thereto. The first period PR1 may be repeated, for example, three or more times.

Figure 13:
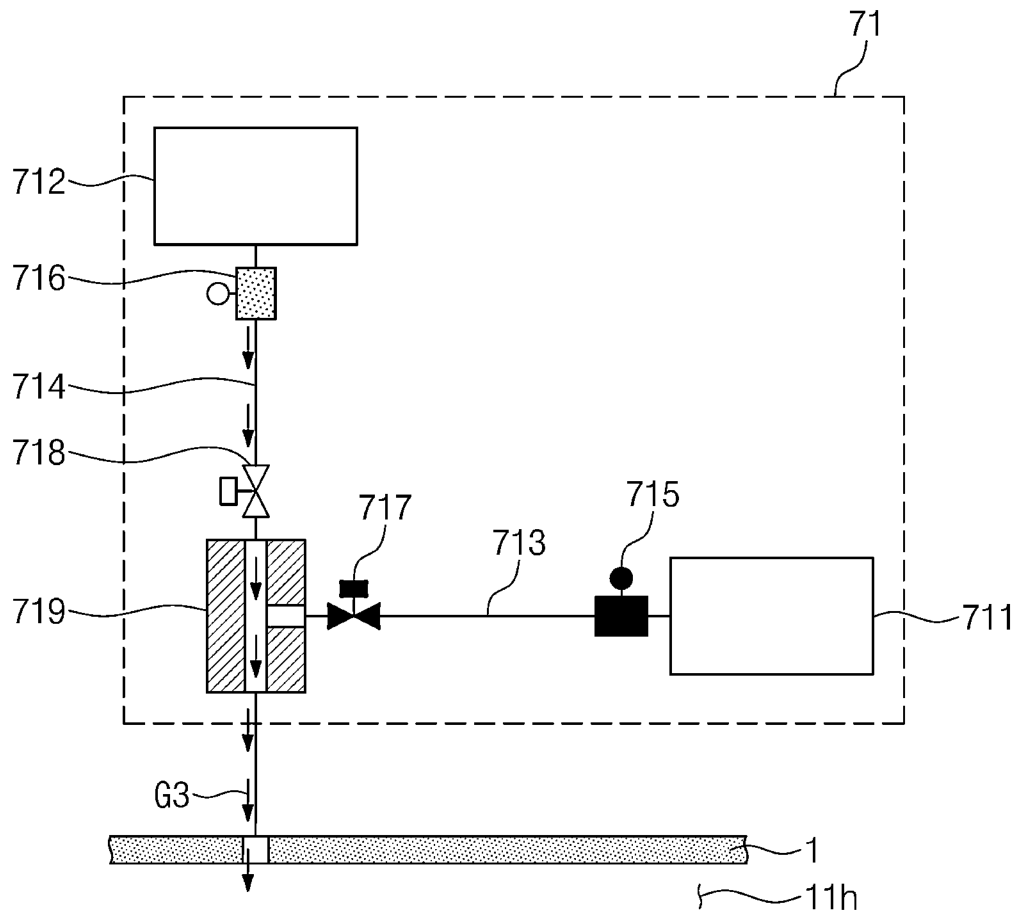

Referring to FIGS. 6, 10, and 13, the operation S22 of supplying the third gas to the first substrate may include, after the supply of the first gas G1 (see FIG. 9), allowing a third gas G3 supplied from the third gas tank 712 to be sprayed along the third supply line 714 into the first distribution space 11*h* of the process chamber 1. The third gas G3 may sequentially pass through the third MFC 716 and the third valve 718. In this procedure, no gas may be supplied from the first gas tank 711 to the process chamber 1. The first valve 717 may be in a closed state. The third gas G3 sprayed onto the first distribution space 11*h* may be supplied through the first showerhead 51 to the first substrate W1. A portion of the third gas G3 may be deposited on the first substrate W1, and another portion of the third gas G3 may be outwardly discharged through the main vacuum pump VPh away from the process space 1*h*.

Similar to the supply of the first gas G1 discussed with reference to FIGS. 11 and 12, the third gas G3 may be supplied in the form of pulse, but embodiments of the present disclosure are not limited thereto.

The supply of the first gas G1 and the supply of the third gas G3 may be alternately and repeatedly performed. Thus, a material of the first gas G1 and a material of the third gas G3 may be deposited on the first substrate W1.

Figure 14:
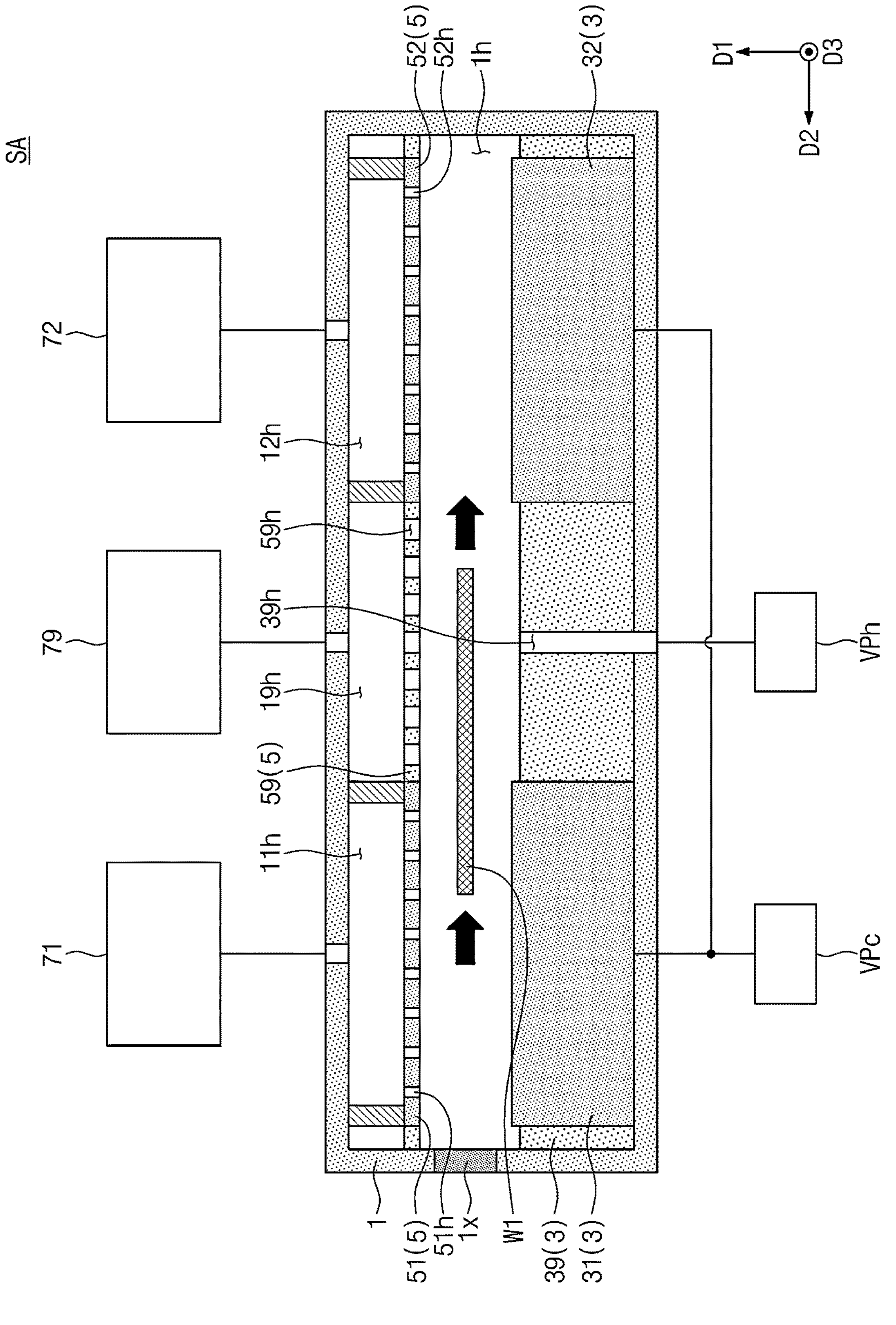
Figure 15:
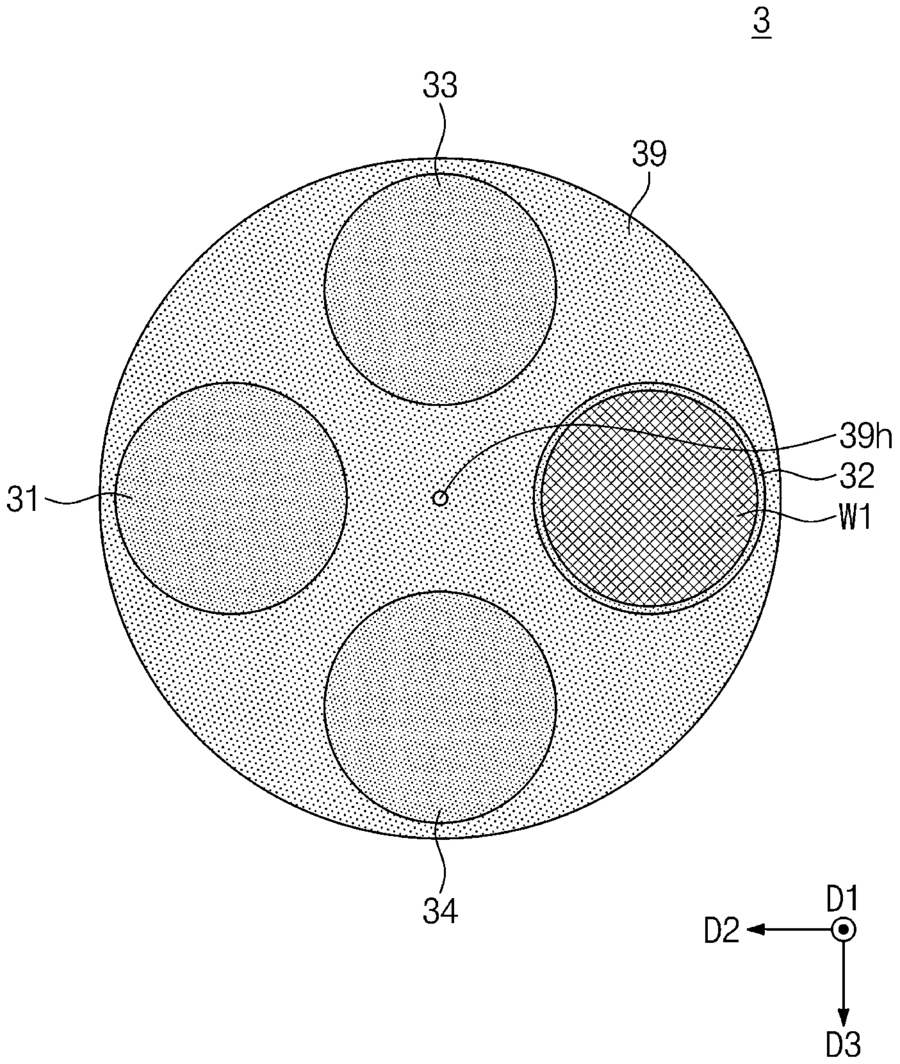

Referring to FIGS. 6, 14, and 15, the operation S3 of allowing the first substrate to move to the second stage may include unloading the first substrate W1, which has experienced the first deposition process, from the first stage 31 and allowing the first substrate W1 to move to the second stage 32. The first substrate W1 may be rigidly placed on the second stage 32.

Figure 16:
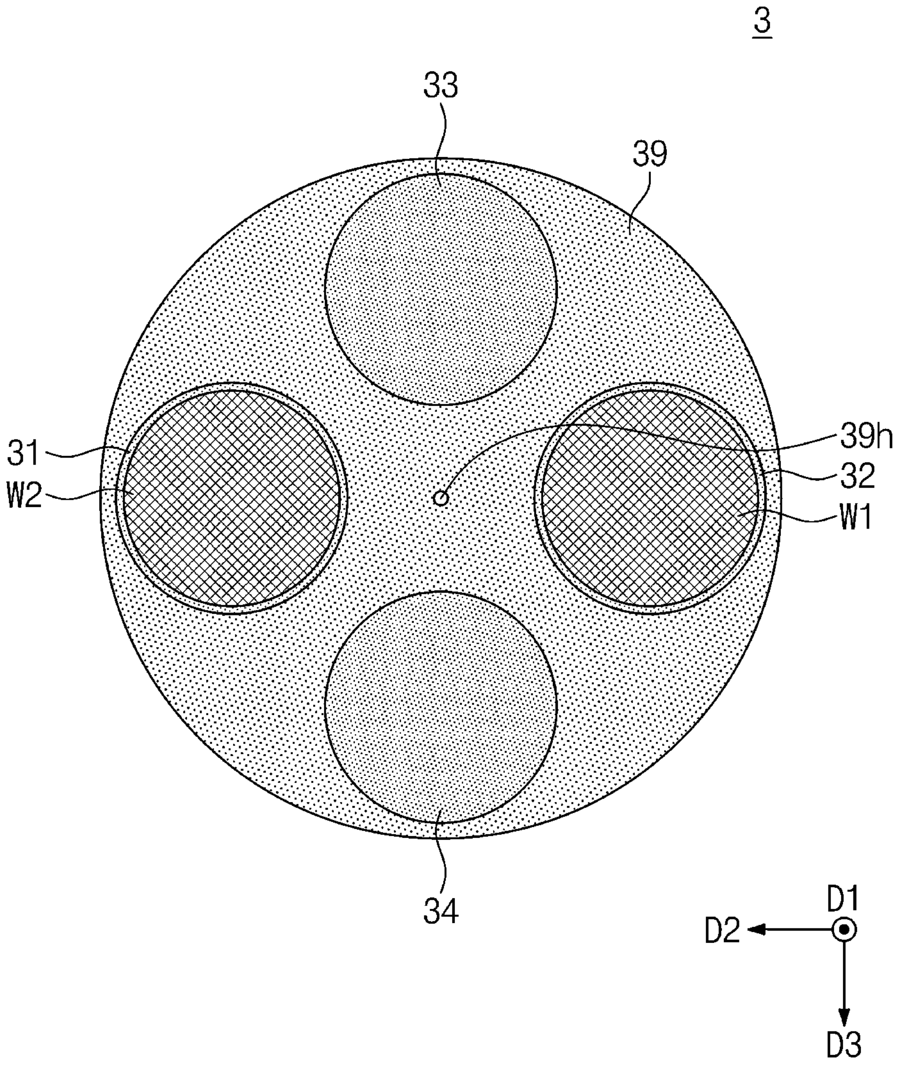

Referring to FIGS. 6 and 16, the operation S4 of placing the second substrate on the first stage may include allowing the first stage 31 to receive thereon a second substrate W2 inserted into the process chamber 1 (see FIG. 14). The operation S4 of placing the second substrate on the first stage may be performed simultaneously with the operation S3, but embodiments of the present disclosure are not limited thereto.

Figure 17:
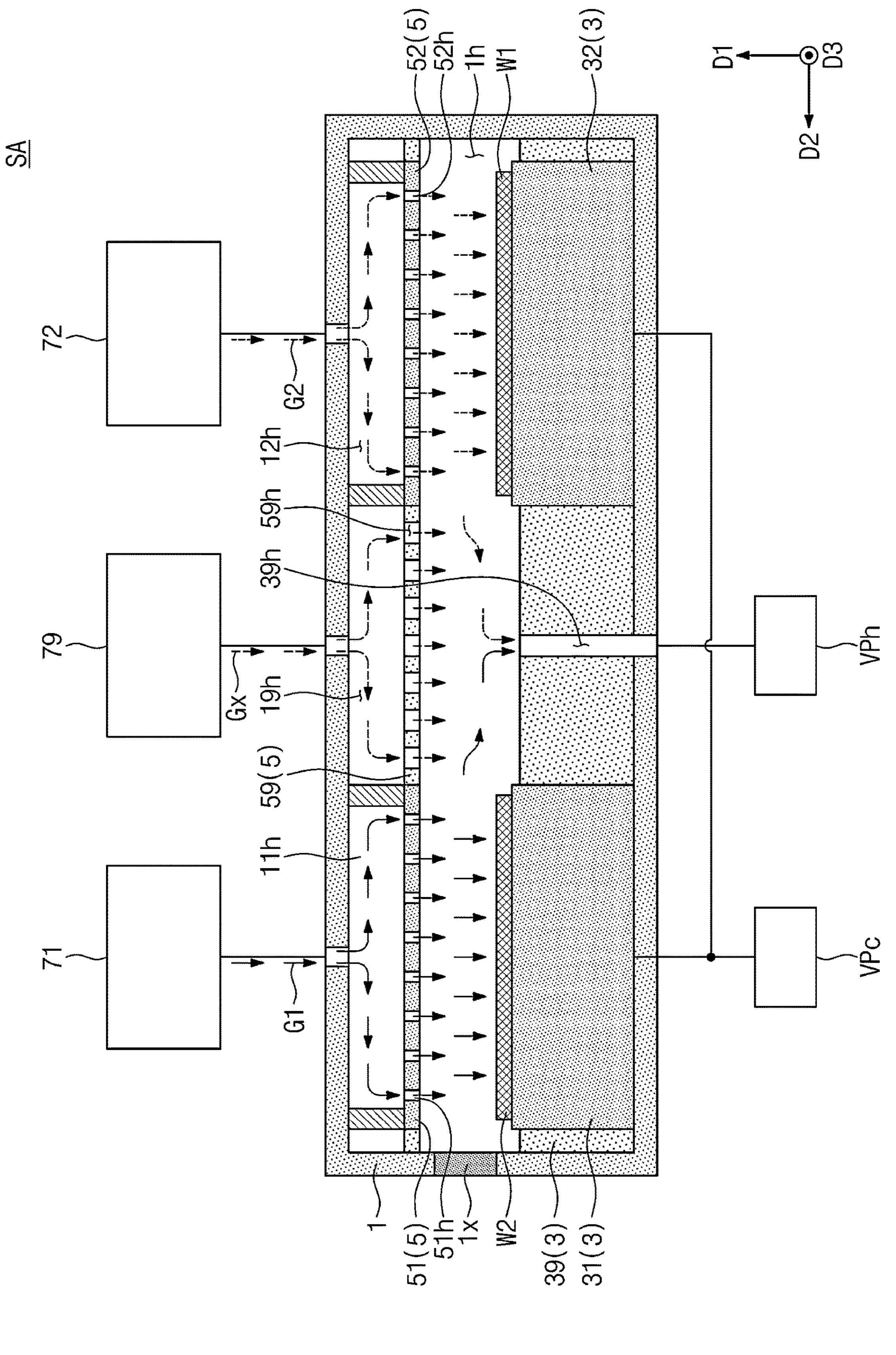
Figure 18:
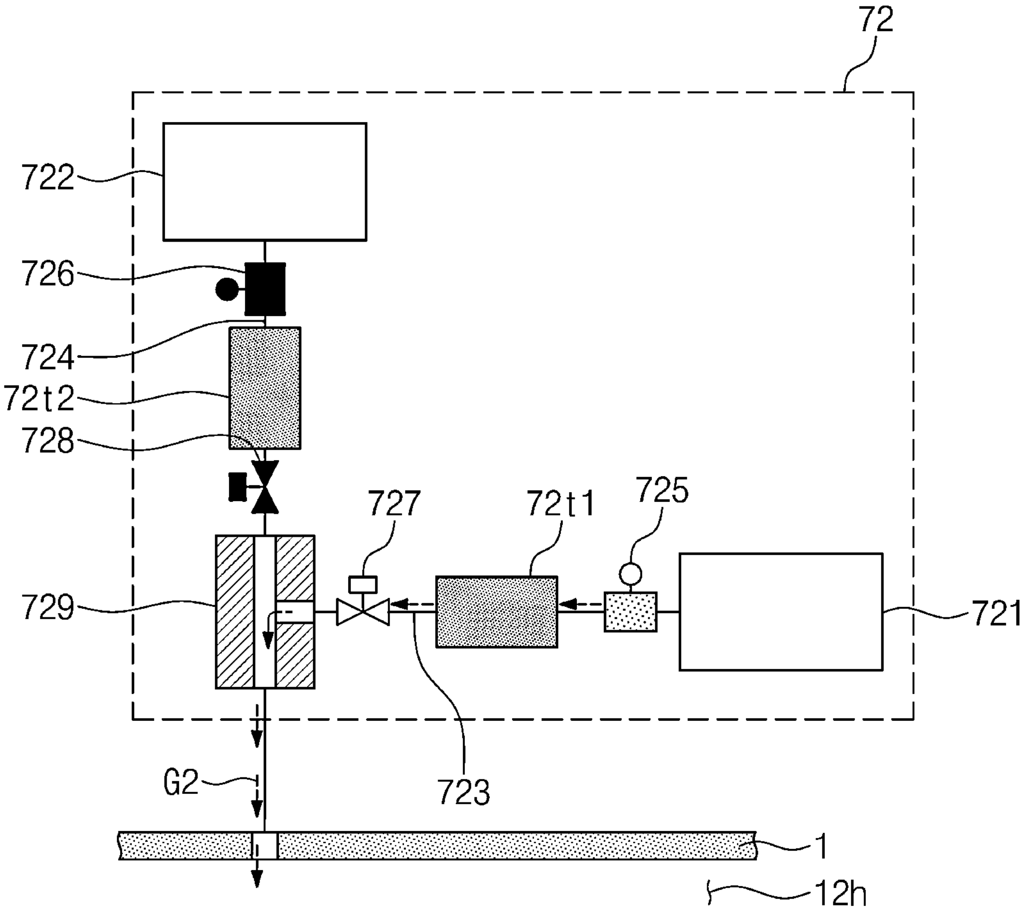

Referring to FIGS. 6, 17, and 18, the operation S51 of supplying the second gas to the first substrate may include allowing a second gas G2 supplied from the second gas tank 721 to be sprayed through the second supply line 723 into the second distribution space 12*h*. The second gas G2 may sequentially pass through the second MFC 725, the first charge tank 72*t*1, and the second valve 727.

Figure 19:
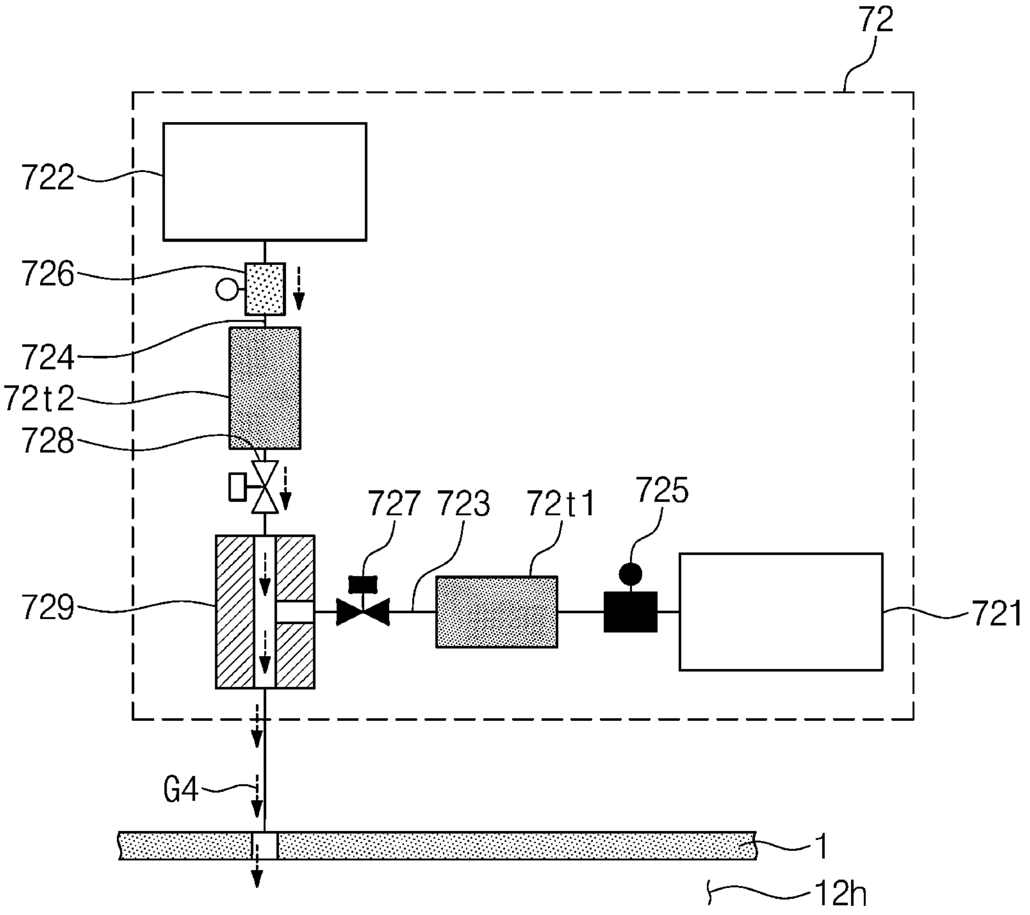

Referring to FIGS. 6 and 19, the operation S52 of supplying the fourth gas to the first substrate may include allowing a fourth gas G4 supplied from the fourth gas tank 722 to be sprayed through the fourth supply line 724 into the second distribution space 12*h*. The fourth gas G4 may sequentially pass through the fourth MFC 726, the second charge tank 72*t*2, and the fourth valve 728.

The operation S51 of supplying the second gas to the first substrate and the operation S52 of supplying the fourth gas to the first substrate may be alternately and repeatedly performed.

Figure 20:
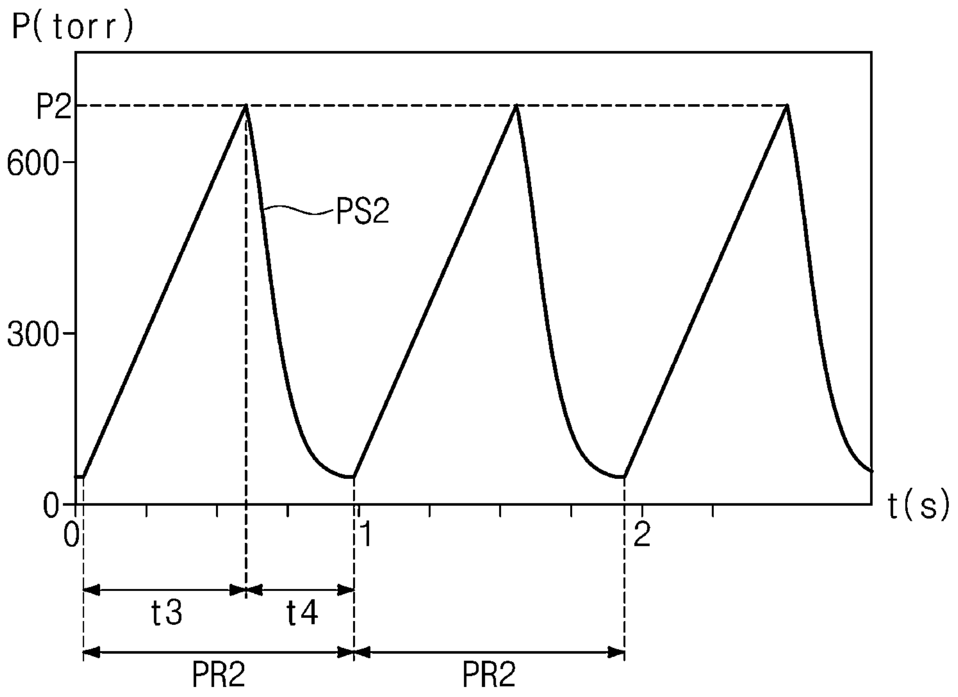

Referring to FIG. 20, a horizontal axis may indicate time. A unit of the horizontal axis may be seconds. A vertical axis may indicate pressure. For example, the horizontal axis may refer to a pressure in the first charge tank 72*t*1 (see FIG. 18). The vertical axis of FIG. 20 may refer to a pressure of the second gas G2 (see FIG. 18) in the first charge tank 72*t*1. A unit of the vertical axis may be Torr.

Referring to FIGS. 6, 19, and 20, the operation S51 of supplying the second gas to the first substrate may include supplying the second gas G2 in a second pulse PS2. For example, the second gas G2 may be supplied in the form of the second pulse PS2. When the second valve 727 is closed, the first charge tank 72*t*1 may be charged with the second gas G2. The first charge tank 72*t*1 may be charged with the second gas G2 for a third time length t3. The third time length t3 may range from about 0.1 second to about 1 second. A pressure of the second gas G2 in the first charge tank 72*t*1 may increase to a second pressure P2. The second pressure P2 may be greater than the first pressure P1 (see FIG. 11). For example, the first pressure P1 may be less than the second pressure P2. The second pressure P2 may range from about 200 Torr to about 700 Torr, but embodiments of the present disclosure are not limited thereto. The second gas G2 introduced into the first charge tank 72*t*1 may be sprayed into the second distribution space 12*h* for a fourth time length t4. The fourth time length t4 may range from about 0.1 second to about 1 second. A sum of the third time length t3 and the fourth time length t4 may be called a second period PR2. The second period PR2 may be a period of the second pulse PS2. The second period PR2 may be longer than the first period PR1 (see FIG. 11). For example, the first period PR1 may be shorter than the second period PR2. The second period PR2 may range from about 0.1 second to about 1 second, but embodiments of the present disclosure are not limited thereto. The second period PR2 may be repeated, for example, three or more times.

Referring back to FIG. 6, the operation S61 of supplying the first gas to the second substrate and the operation S62 of supplying the third gas to the second substrate may be respectively substantially the same as or similar to the operation S21 of supplying the first gas to the first substrate and the operation S22 of supplying the third gas to the first substrate. For example, the same process may be repeated on different substrates in the same place. In some embodiments, a process executed on the first substrate W1 on the first stage 31 (see FIG. 9) may be performed on the second substrate W2 on the first stage 31.

The second deposition process on the first substrate W1 and the first deposition process on the second substrate W2 may be performed at the same time. In this stage, a shield gas Gx (see FIG. 17) may be provided between the first stage 31 and the second stage 32. For example, the shield gas Gx supplied from the shield gas supply unit 79 may be supplied through the main showerhead 59 to a space between the first substrate W1 and the second substrate W2. It may therefore be possible to prevent the first gas G1 and the second gas G2 from being mixed with each other.

Figure 21:
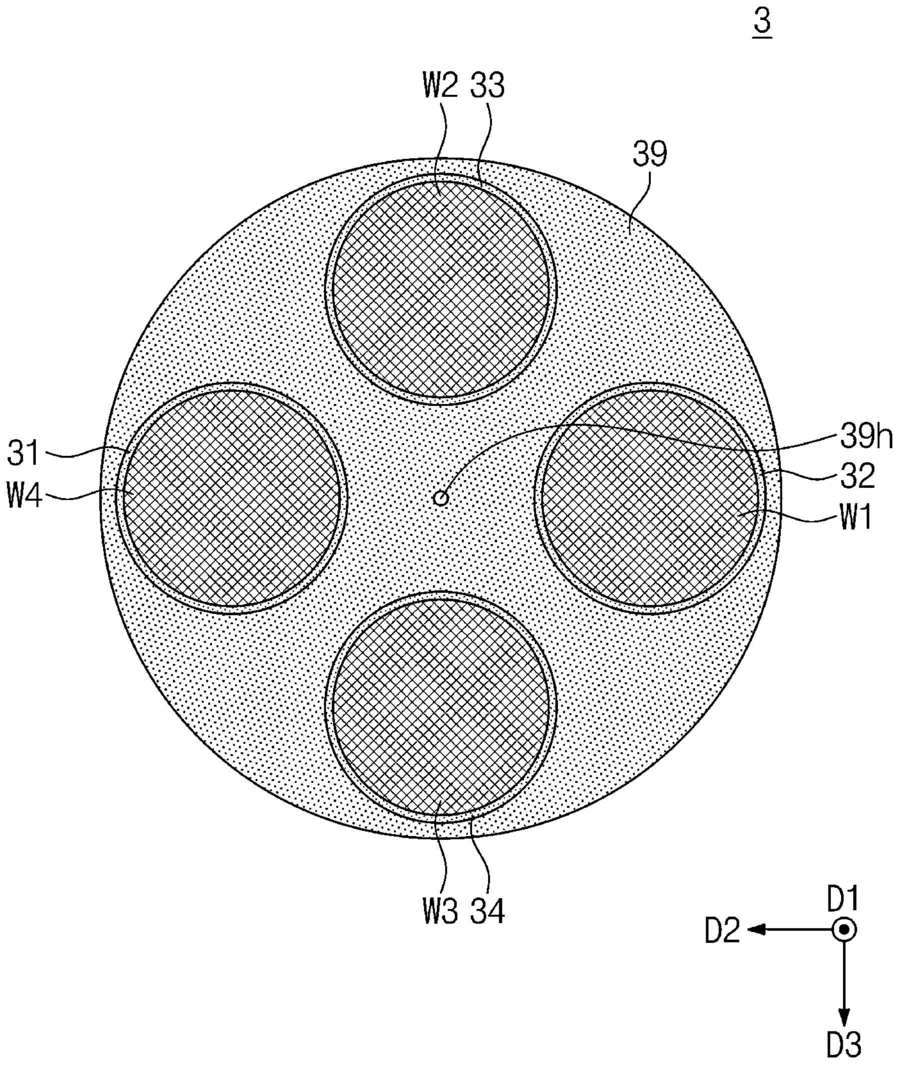

Referring to FIG. 21, the second substrate W2 may move onto the third stage 33. On the third stage 33, the second deposition process may be performed on the second substrate W2. The fourth stage 34 may receive thereon a third substrate W3 that has experienced the first deposition process on the first stage 31. On the fourth stage 34, the second deposition process may be performed on the third substrate W3. The first deposition process may be performed on the fourth substrate W4 in a state that the fourth substrate W4 is disposed on the first stage 31. For example, four substrates may undergo a deposition process at the same time in one process chamber 1 (see FIG. 17). A process time required for performing the second deposition process may be the same as or longer than about three times a process time required for performing the first deposition process. Therefore, even though the first deposition process is performed for a long time at a low pressure, an overall process time may not increase.

According to a substrate processing apparatus and a substrate processing method using the same in accordance with some embodiments of the present disclosure, as a first gas is supplied at a low pressure, it may be possible to reduce an amount of a first gas discharged without being deposited on a substrate. For example, the first gas may be supplied at a low pressure to increase deposition efficiency of the first gas. Thus, consumption of the first gas may decrease. To uniformly supply the first gas at a low pressure, a charging time of the first gas may be greater than a supplying time of the first gas. Accordingly, even when a process is performed at a low pressure, the first gas may be uniformly and stably distributed on a substrate.

According to a substrate processing apparatus and a substrate processing method using the same in accordance with some embodiments of the present disclosure, one stage may be provided to perform a first deposition process. In contrast, three stages may be provided to perform a second deposition process. A process time required for performing the second deposition process may be the same as or longer than about three times a process time required for forming the first deposition process. Thus, although the first deposition process may require a longer time because supply of the first gas is performed at a lower pressure than that of supply of the second gas, an overall process time may not increase.

According to a substrate processing apparatus and a substrate processing method using the same in accordance with some embodiments of the present disclosure, no charge tank may be needed to charge the first gas at a high pressure. Thus, it may be possible to simplify equipment.

According to a substrate processing apparatus and a substrate processing method using the same in accordance with some embodiments of the present disclosure, as a first gas is supplied at a low pressure, the first gas and a third gas may be prevented from being mixed in a first gas supply unit. For example, as the first gas is supplied at a low pressure, the first gas may be prevented from being mixed with the third gas caused by flowing backwards toward a third supply line in a first connection unit. It may thus be possible to prevent particles from occurring due to mixing of the first gas and the third gas in the first gas supply unit. Accordingly, substrate contamination due to particles may be reduced.

Figure 22:
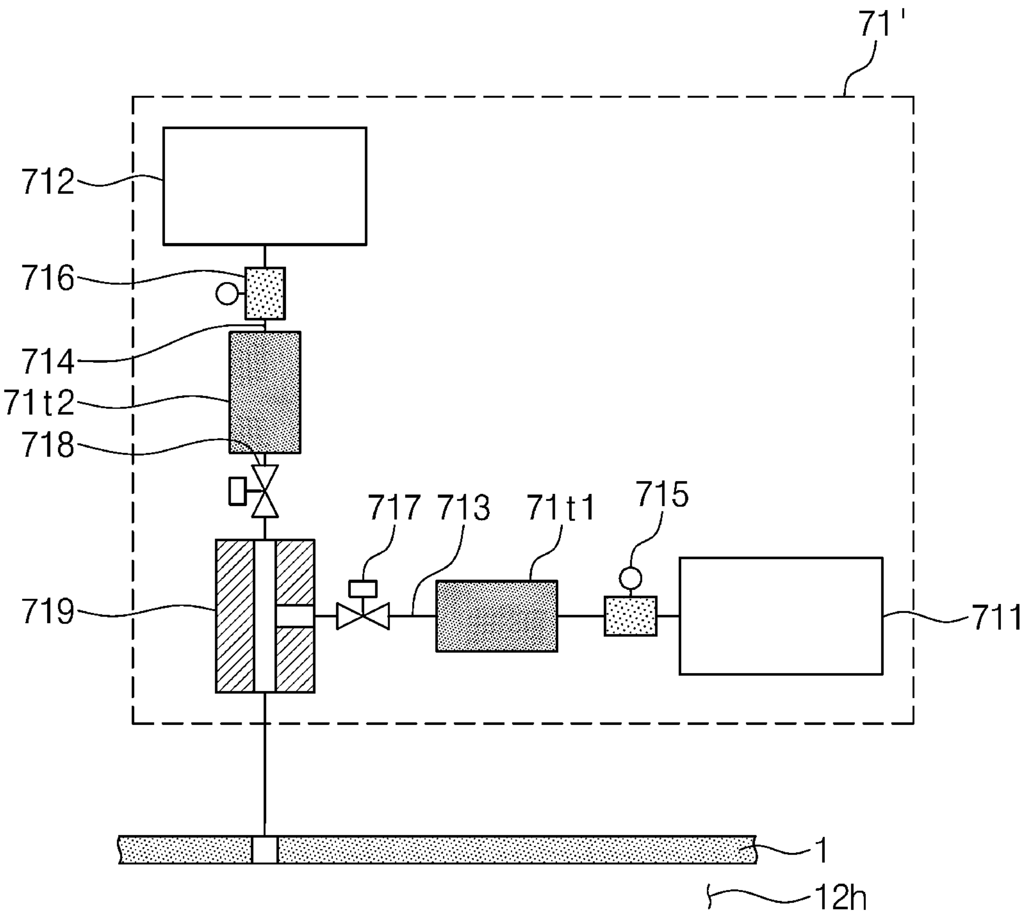
FIG. 22 illustrates a schematic diagram showing a first gas supply unit according to some embodiments of the present disclosure.

FIG. 22 illustrates a schematic diagram showing a first gas supply unit according to some embodiments of the present disclosure.

The following may omit repeated descriptions that are substantially the same as or similar to descriptions given above with reference to FIGS. 1 to 21.

Referring to FIG. 22, a first gas supply unit 71' may further include a third charge tank **71*t*1 and a fourth charge tank 71*t*2**.

The third charge tank **71*t*1 may be positioned on the first supply line 713 between the first MFC 715 and the first valve 717. The third charge tank 71*t*1** may be filled with the first gas at a low pressure.

The fourth charge tank **71*t*2 may be positioned on the third supply line 714 between the third MFC 716 and the third valve 718. The fourth charge tank 71*t*2** may be filled with the second gas at a low pressure.

According to embodiments of the present disclosure, the substrate processing apparatus SA may further include a controller that is configured to control other components of the substrate processing apparatus SA to perform their respective functions. For example, the controller may be configured to control the various gas supply units (e.g., the first gas supply unit 71, the second gas supply unit 72, and the shield gas supply unit 79), including the valves and FMCs thereof, and the various vacuum pumps (e.g., the fixed vacuum pump VPc and the main vacuum pump VPh)) to perform their respective functions. The controller may control the substrate processing apparatus SA, and the components thereof, such that methods of embodiments of the present disclosure (e.g., the substrate processing method SS of FIG. 6) are performed.

According to embodiments of the present disclosure, the controller may include at least one processor and memory storing computer instructions. The computer instructions may be configured to, when executed by the at least one processor, cause the controller to perform its functions.

According to a substrate processing apparatus and a substrate processing method using the same in accordance with some embodiments of the present disclosure, a first gas supply unit may include a charge tank. The first gas may be charged at a low pressure in the charge tank, and may then be supplied to a substrate.

According to a substrate processing apparatus and a substrate processing method using the same in accordance with some embodiments of the present disclosure, it may be possible to achieve uniform deposition while reducing gas consumption.

According to a substrate processing apparatus and a substrate processing method using the same in accordance with some embodiments of the present disclosure, it may be possible to suppress an increase in overall process time.

According to a substrate processing apparatus and a substrate processing method using the same in accordance with some embodiments of the present disclosure, it may be possible to simplify equipment.

According to a substrate processing apparatus and a substrate processing method using the same in accordance with some embodiments of the present disclosure, the occurrence of particles may be prevented to reduce substrate contamination.

Effects of embodiments of the present disclosure are not limited to the effects mentioned above, and other effects which have not been mentioned above will be clearly understood to those skilled in the art based on the above description.

Although non-limiting example embodiments of the present disclosure have been described in connection with the accompanying drawings, it will be understood to those skilled in the art that various changes and modifications may be made without departing from the technical spirit and scope of the present disclosure. It therefore will be understood that the embodiments described above are just illustrative and are not limitative in all aspects.

What is claimed is:

1. A substrate processing method, comprising:

placing a first substrate on a first stage in a process chamber of a substrate processing apparatus;

placing a second substrate on a second stage in the process chamber, the second stage spaced apart in at least one horizontal direction from the first stage;

performing a first deposition process on the first substrate; and performing a second deposition process on the second substrate, wherein the performing the first deposition process comprises supplying the first substrate with a first gas, wherein the performing the second deposition process comprises supplying the second substrate with a second gas different from the first gas, wherein the supplying the first substrate with the first gas comprises alternately and repeatedly performing steps of:

filling a first gas supply unit of the substrate processing apparatus with the first gas for a first time length, the first gas supply unit being upwardly spaced apart from the first stage; and supplying the first substrate with the first gas, that is in the first gas supply unit, for a second time length, wherein the second time length is greater than the first time length, and wherein the first gas supply unit includes:

a first gas tank;

a first supply line that connects the first gas tank and the process chamber to each other;

a first mass flow controller (MFC) on the first supply line; and a first valve on the first supply line and between the first MFC and the process chamber.

2. The substrate processing method of claim 1, wherein the filling the first gas supply unit with the first gas for the first time length comprises causing the first gas to fill the first supply line between the first valve and the first MFC by closing the first valve.

3. The substrate processing method of claim 1, wherein the first gas supply unit further includes a first charge tank on the first supply line between the first MFC and the first valve, wherein the filling the first gas supply unit with the first gas for the first time length comprises filling the first charge tank with the first gas by closing the first valve.

4. The substrate processing method of claim 1, wherein the filling the first gas supply unit with the first gas for the first time length comprises causing the first gas to have a maximum pressure of equal to or less than 100 Torr in the first gas supply unit.

5. The substrate processing method of claim 1, wherein the first time length is in a range of 0.1 second to 1 second.

6. The substrate processing method of claim 1, wherein the supplying the first substrate with the first gas for the second time length comprises supplying the first gas to the first substrate such that the first gas introduced into the process chamber has a maximum pressure of equal to or less than 10 Torr.

7. The substrate processing method of claim 1, wherein the performing the first deposition process further comprises supplying the first substrate with a third gas after the supplying the first substrate with the first gas.

8. The substrate processing method of claim 1, wherein the first gas includes B2H6, and the second gas includes H2.

9. The substrate processing method of claim 1, wherein the supplying the second substrate with the second gas comprises:

filling, with the second gas, a second charge tank of a second gas supply unit upwardly spaced apart from the second stage; and supplying the second substrate with the second gas introduced into the second charge tank, wherein the filling the first gas supply unit with the first gas for the first time length comprises causing the first gas in the first gas supply unit to have a first pressure or lower as a maximum pressure of the first gas, wherein the filling the second charge tank with the second gas comprises causing the second gas in the second charge tank to have a second pressure or higher as a maximum pressure of the second gas, and wherein the second pressure is greater than the first pressure.

10. The substrate processing method of claim 1, further comprising supplying a shield gas to a space between the first stage and the second stage while the first deposition process is performed.

11. The substrate processing method of claim 1, further comprising:

placing a third substrate on a third stage in the process chamber, the third stage being spaced apart in the at least one horizontal direction from the second stage;

placing a fourth substrate on a fourth stage in the process chamber, the fourth stage being spaced apart in the at least one horizontal direction from the third stage;

performing the second deposition process on the third substrate; and performing the second deposition process on the fourth substrate, wherein the second deposition process is performed on the second substrate for a time that is the same as or longer than three times a time in which the first deposition process is performed.

12. The substrate processing method of claim 1, wherein the filling the first gas supply unit with the first gas for the first time length and the supplying the first substrate with the first gas are alternately and repeatedly performed three or more times.

13. A substrate processing method, comprising:

forming a seed layer on a first substrate on a first stage in a process chamber;

moving the first substrate having the seed layer to a second stage in the process chamber; and forming a bulk layer on the first substrate on the second stage, wherein forming the seed layer on the first substrate comprises supplying the first substrate with a first gas in a first pulse, wherein the forming the bulk layer on the first substrate comprises supplying the first substrate with a second gas in a second pulse, wherein the supplying the first substrate with the first gas in the first pulse comprises:

filling, with the first gas, a first gas supply unit upwardly spaced apart from the first stage, the first gas reaching a first pressure; and supplying the first substrate with the first gas introduced into the first gas supply unit, wherein the supplying the first substrate with the second gas in the second pulse comprises:

filling, with the second gas, a second gas supply unit upwardly spaced apart from the second stage, the second gas reaching a second pressure; and supplying the first substrate with the second gas introduced into the second gas supply unit, and wherein the first pressure is less than the second pressure, wherein the first gas supply unit includes:

a first gas tank;

a first supply line that connects the first gas tank and the process chamber to each other;

a first mass flow controller (MFC) on the first supply line; and a first valve on the first supply line and between the first MFC and the process chamber.

14. The substrate processing method of claim 13, wherein the first pressure is equal to or less than 100 Torr, and the second pressure is in a range of 200 Torr to 700 Torr.

15. The substrate processing method of claim 13, wherein the filling the first gas supply unit with the first gas at the first pressure is performed for a first time length, the supplying the first substrate with the first gas is performed for a second time length, and the second time length is greater than the first time length.

16. The substrate processing method of claim 13, wherein a period of the first pulse is longer than a period of the second pulse.

17. The substrate processing method of claim 13, wherein the first gas includes B2H6, and the second gas includes H2.

18. The substrate processing method of claim 15, wherein the first time length is in a range of 0.1 second to 1 second.

* * * * *